United States Patent [19]

Andermo et al.

[11] Patent Number: 5,225,830
[45] Date of Patent: Jul. 6, 1993

[54] COMBINATION OPTICAL AND CAPACITIVE ABSOLUTE POSITION APPARATUS AND METHOD

[75] Inventors: Nils I. Andermo; Tracy E. Hanley, both of Kirkland; Philip S. Lane, Snohomish, all of Wash.

[73] Assignee: Mitutoyo, Tokyo, Japan

[21] Appl. No.: 661,840

[22] Filed: Feb. 26, 1991

[51] Int. Cl.⁵ .............................................. H03M 1/22
[52] U.S. Cl. ....................... 341/13; 341/15; 341/9; 33/706
[58] Field of Search .................. 341/13, 15, 14, 16, 341/9; 33/706, 707; 250/237 G, 231.16; 324/457, 207.14, 207.24, 207.25

[56] References Cited

U.S. PATENT DOCUMENTS 3,812,352 5/1974 MaGovern .
4,152,837 5/1979 Nelle et al. .
4,218,615 8/1980 Zinn, Jr. .
5,062,214 11/1991 Gustafsson et al. .................. 33/706

FOREIGN PATENT DOCUMENTS

WO88/02848 10/1987 PCT Int'l Appl. .

Primary Examiner—Sharon D. Logan
Attorney, Agent, or Firm—Seed and Berry

[57] ABSTRACT

A combined optical and capacitive absolute positioning encoding system uses a plurality of metallized strips deposited onto a glass scale substrate. A movable transceiver is positioned adjacent to the scale. The transceiver generates interrogating electrical an optical signals which interact with the scale. The movable transceiver also carries with it receiver mechanisms for receiving the signals after interaction with the scale. Signal processing electronics are provided to determine the relative positions of the scale and transceiver by comparing the transmitted, interrogating signals with the received signals. The system is able to determine the relative positions of the scale and transceiver even if power to the system is interrupted, or if the scale and transceiver are moved relative to one another very rapidly.

38 Claims, 10 Drawing Sheets

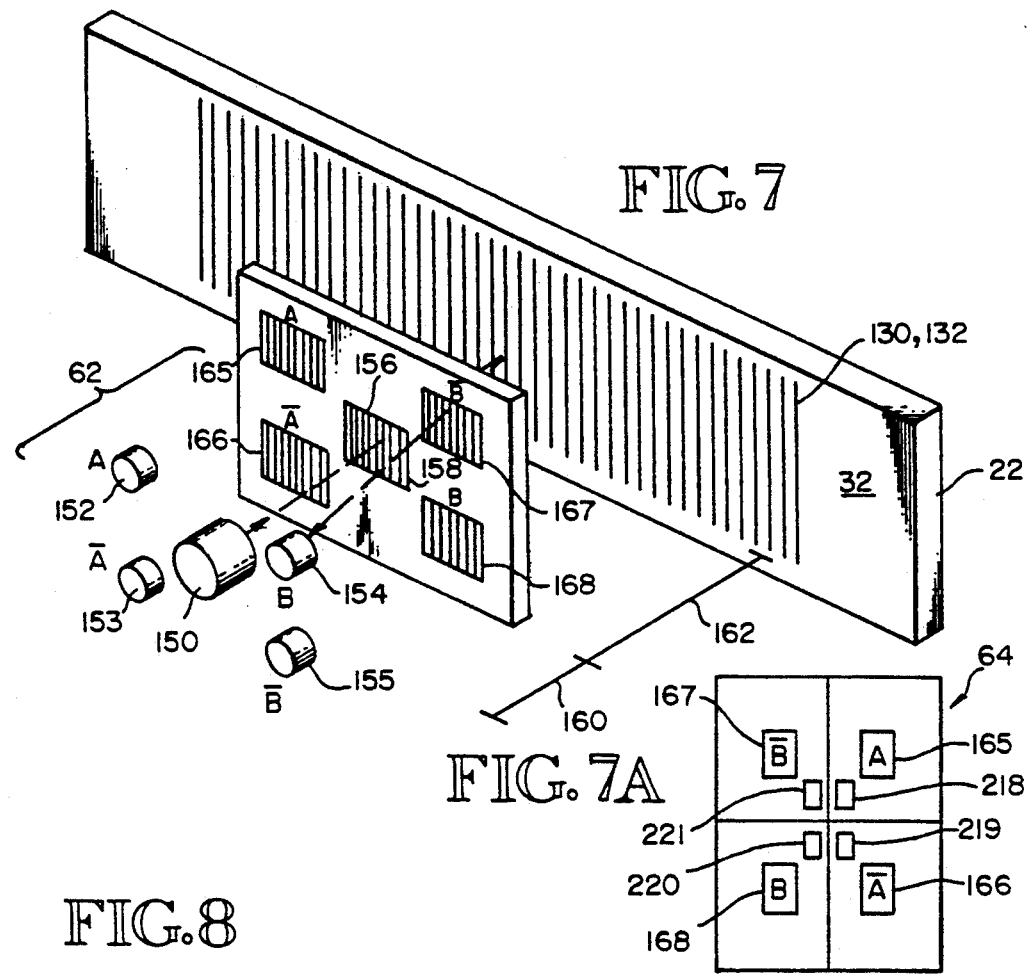
FIG. 7
FIG. 7A
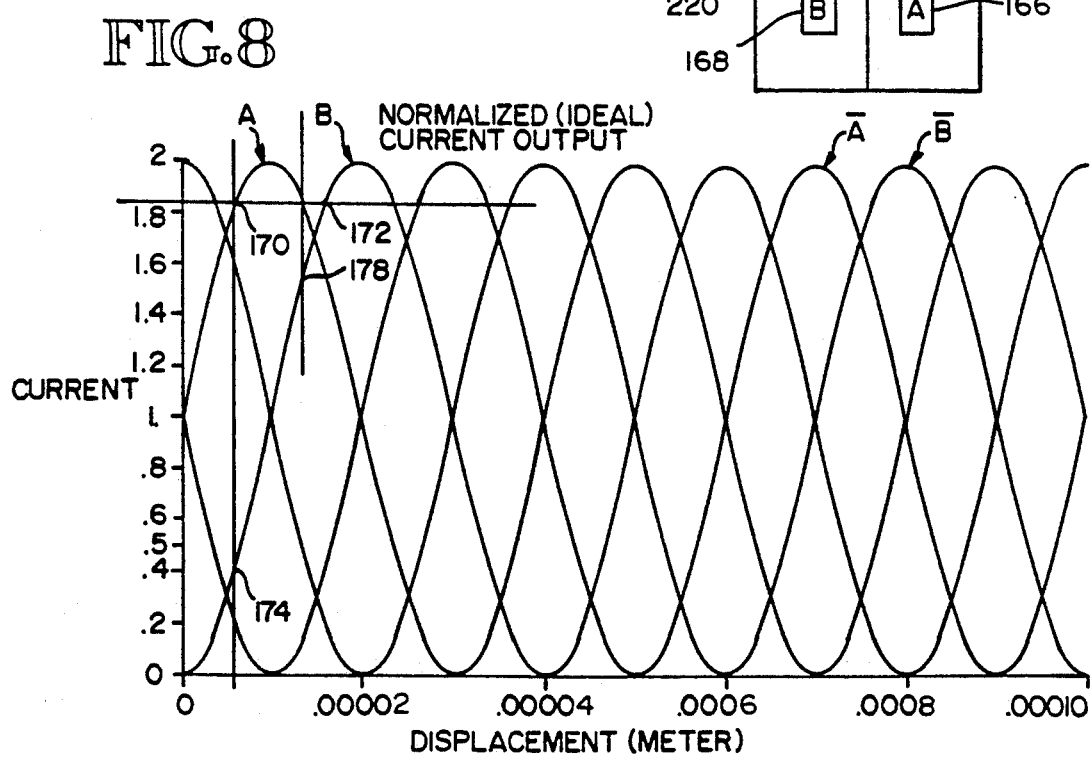
FIG. 8

COMBINATION OPTICAL AND CAPACITIVE ABSOLUTE POSITION APPARATUS AND METHOD

TECHNICAL FIELD

The invention relates to mensuration apparatus and techniques. More specifically, the invention relates to mensuration apparatus and techniques for absolutely determining the relative position of two members to a high resolution over a large relative range.

BACKGROUND OF THE INVENTION

Mensuration devices for industrial applications utilize a variety of different techniques for determining the relative position of two objects with respect to one another. Such devices are especially useful in the machine tool and robotics industries for determining the relative position of two moving parts. As an example, it is highly desirable to accurately know the position of a cutting tool with respect to a lathe bed, or a milling head with respect to a workpiece for high-precision machining. Electronic and optical encoding systems are available which can interface with the electronic control system of automated machine tools so that such tools can perform pre-programmed operations on a workpiece with relative position feedback. Much higher machining accuracies can be achieved with a technique of this type, rather than merely relying on pre-programmed positioning of a cutting head in an open-loop system. In the robotics industry, it is clearly desirable for industrial robots to know the relative position of arms, manipulators, etc., with respect to the robot body.

There is an increasing need in the industry for Absolute measurements in encoders used for measurement and control. (Hereafter, absolute measurement, meaning that a reference scale includes a unique information content at each possible measuring coordinate, will be referred to as "ABS" measurement). A common solution for this is optical encoders with several binary related tracks. For instance, for a measurement range of 1 meter and a resolution of 1 micron, about 17 encoder tracks are needed for an Absolute scale of this type, (Finest track with 20 micron wavelength, interpolated down to 1 micron plus 16 tracks for binary definition of coarse ABS position on the scale). The detector for those sever tracks requires 4 photoelements each for accurately detecting the position within each track. This means 17*4=68 photoelements with associated electronic circuits, whose relative sensitivity and DC offset have to be adjusted for uniformity within each channel. There are cost and reliability penalties with such an optical ABS system.

There also exists a capacitive displacement sensor system (U.S. Pat. Nos. 4,879,508 and 4,878,013) which is capable of measuring ABS position over a large relative range. That system has simple detector elements (capacitive electrodes on a printed circuit readhead) and does not require any critical adjustment for reaching a high interpolation rate, and can cover a large relative range with only three channels. Its limitation is the ability to work with small enough scale pattern wavelength, and high enough interpolation rate, to reach resolutions of 1 micron or lower. A small pattern wavelength will require a small well controlled gap between scale and detector head, which can be impractical and costly for long scales.

A single channel optical system has, on the other hand, a potential of reaching improved resolution down to fractions of microns by utilizing shorter wavelength on the scale pattern and higher interpolation rate without severe cost penalties. There also are several possibilities to design the optical system with diffraction-based detector heads, that can resolve a fine scale pitch with a relatively large gap between scale and detector head.

Such a single channel optical system can work well with a scale pattern of wavelength on the order of 20 microns. Interpolating by a factor of 20 then gives 1 micron resolution. Interpolating by a factor of 100 gives a resolution of 0.2 micron. The problem is, however, that a perfectly infallible counter is required in such a system, for measurement of displacements greater than 20 microns. Otherwise, there is an ambiguity in the measured value, of (N * 20 microns). Such an ambiguity will occur following any disruption of the "infallible counter", such as that due to a power failure, or electrical interference, etc.

Such a result would have disastrous consequences in a fully-automatic machine tool unless the machine tool were programmed to shut down in the event of a power failure, transient power spike, etc.

Typical optical systems are described in U.S. Pat. No. 4,218,615, to Zinn, Jr., and U.S. Pat. No. 3,812,352, to MacGovern. These systems rely on the generation of point sources from a conventional light source through use of grating, etc. These point sources are reflected off or passed through an optical pattern on a scale portion. The scale pattern itself may form a second grating so as to establish a periodic pattern using the point sources generated by the light source first grating. Very high resolutions can be achieved with systems of this type. However, these optical systems do not know the relative displacement of the scale and pick-off portions if power is interrupted, or if the relative portions move too quickly for the electronic counters.

Thus, a need exists for a more economical, reliable, and compact absolute position encoding system which has high resolution and which is not limited by reliance upon counter the number of steps which a pick-off or transducer has been displaced from an origin on a scale.

SUMMARY OF THE INVENTION

It is therefore an object of the present invention to obtain absolute position data for two relatively moving portions, such as a scale and a pick-off or transducer with a high resolution, over a relatively large range.

It is yet another object of the invention to achieve the above object with a system that knows the relative displacement of the transducer or pick-off portion and scale portion regardless of how quickly the portions have moved relative to one another.

It is still another object of the invention to achieve the above two objects with a system which can determine the relative displacement of a transducer or pick-off portion with respect to a scale portion even if power to the system is interrupted.

The invention achieves the above objects, and other objects and advantages which will become apparent from the description which follows, by providing an absolute position determining system utilizing relatively moveable scale and transceiver portions which employ two regular patterns integrated into a single pattern. The two regular patterns each interact with interrogating signals which differ qualitatively so as to provide a high system resolution. Signal generating and signal processing circuitry are provided to generate and interpret the interrogating signals to determine relative positions of the scale and transceiver portions within a predetermined error margin.

In a preferred embodiment of the invention, an optical scale is combined with a capacitive scale in a manner that utilizes the same area on the scale substrate for both the optical and the capacitive scale. The capacitive scale is of the mentioned ABS type, with three measuring ranges: Course, Medium and Fine, with an electrode pattern on the scale that consists of three fields. Those three fields have multiple functions in the capacitive system, but they are also utilized for a pattern that serves as an optical encoder scale. The two interrogating signals are an optical signal which illuminates an optical pattern integrated into the scale pattern, and an electrical signal which interacts with metallic strips spaced at regular intervals on both the transceiver and scale to measure a capacitive relationship between the two portions. This capacitive data is indicative of the relative positions of the portions. The capacitive system determines the absolute relative position of the scale and transceiver portions to within a first error margin, while the optical system determines the relative positions of the scale and transceiver portions to within a second, smaller error margin, which is unambiguous by virtue of the known capacitive error margin.

The optical and capacitive patterns are integrated into the scale pattern in such a manner that manufacturing irregularities, physical deformation of the scale portion, and changes in temperature tend to affect the optical and capacitive properties of the system equally. Furthermore, an optical transmission apparatus and capacitive electronic transmission apparatus on the transceiver portion can be geometrically arranged so that effects of thermal expansion of the transceiver portion in determining the relative positions of the scale and transceiver portions are minimized.

The capacitive system always knows the relative position of the scale and transceiver within its margin of error, which must be less than $\pm \frac{1}{2}$ optical grating pitch. This information can be combined with the optical position information so that the optical system does not need to know its absolute position outside of one optical period. The optical system relies on the capacitive system for this information. The optical system does, however, always know its position within the capacitive system's error margin. As a result thereof, the combination optical and capacitive system can instantly determine the relative position of the scale and transceiver portions no matter how quickly displacement occurs, while maintaining the high resolution capabilities of an optical system.

BRIEF DESCRIPTION OF THE DRAWINGS

FIG. 7 is an enlarged, exploded, isometric representation of an optical system of the present invention.

FIG. 7a is a top plan view of an optical detection window of the present invention.

FIG. 8 is a graph illustrating the optical position signal information received by the optical system of the present invention.

DETAILED DESCRIPTION OF THE INVENTION

Figure 10:
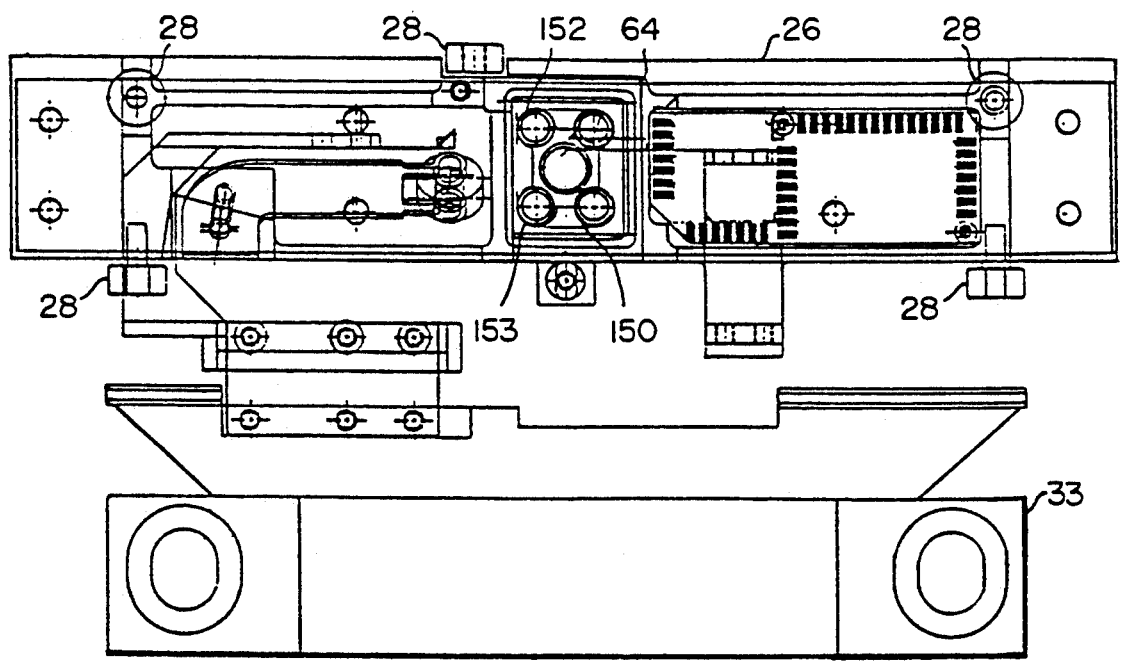
FIG. 10 is an orthographic projection showing two end and one side elevational view of a support mechanism which provides relative movement between the scale and pick-off or transceiver.
Figure 11:
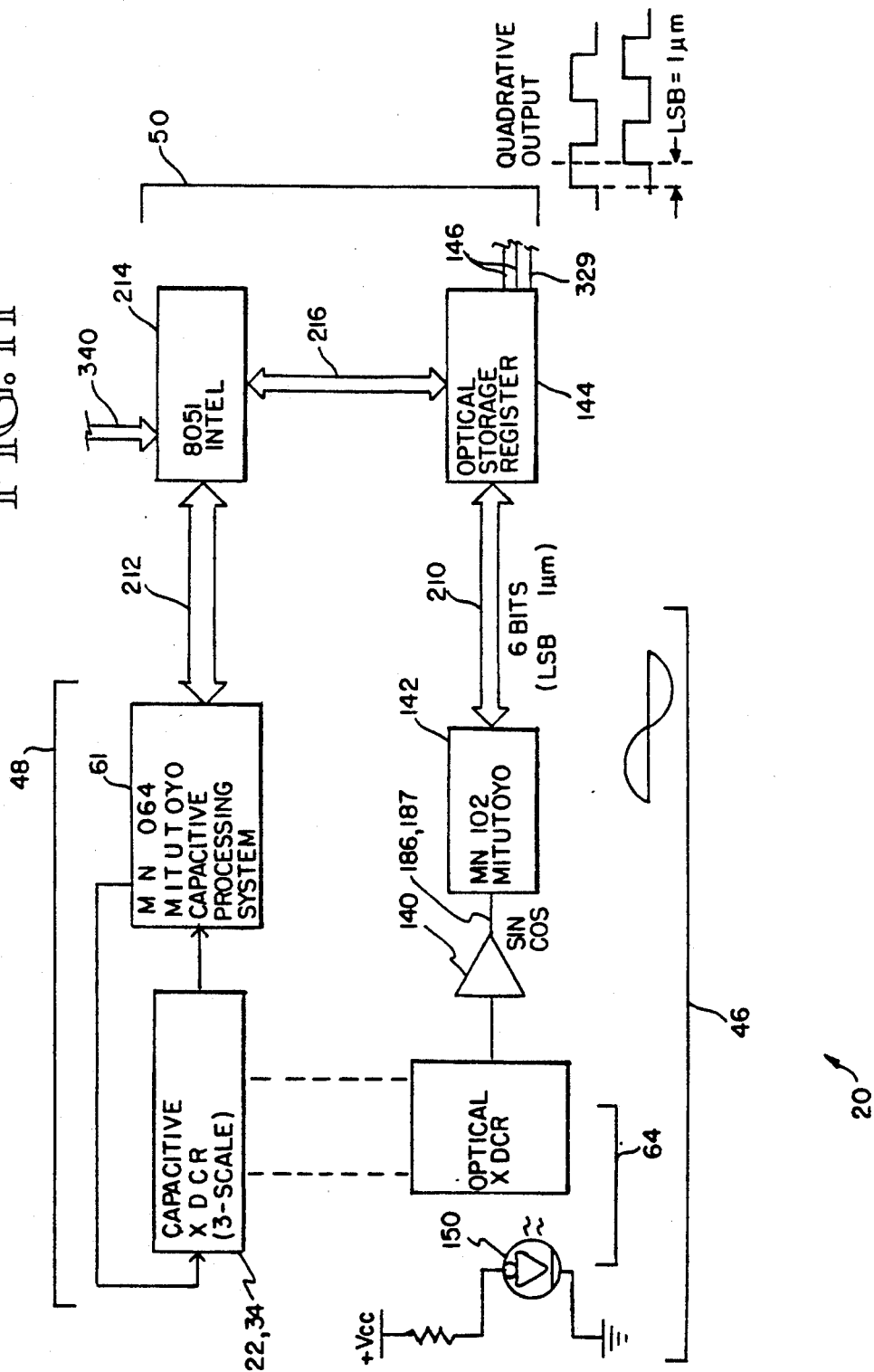
FIG. 11 is a block diagram of the overall system of the present invention.

A combined optical and capacitive absolute position determining system, in accordance with the principles of the present invention, is schematically illustrated at Reference No. 20 in FIG. 11. As best seen in FIG. 10, the system employs an elongated scale 22 which is received in an elongated frame 24. The frame is to be fixed to an object such as the bed of an automated machine tool or the like. The frame also slideably supports a car 26 for movement with respect to the scale 22. The car has wheels 28 which engage tracks 30 in the frame 24 and a front surface 32 of the scale so that a rectangular transceiver or pick-off 34 is positioned at a small gap distance substantially parallel to the front surface 32 of the scale 22 and in alignment with a longitudinal axis of the scale. A slide 33 connects the transceiver to the moving point of the automated machine tool, such as a milling head (not shown). The transceiver and scale each have optical and capacitive patterns deposited thereon, such as by photolithographic methods, which enable the electrical systems shown in FIG. 11 (and to be described in further detail below) to determine the relative position of the transceiver with respect to the scale to within an error of approximately $\pm 1$ μm.

SYSTEM OVERVIEW

Figure 1:
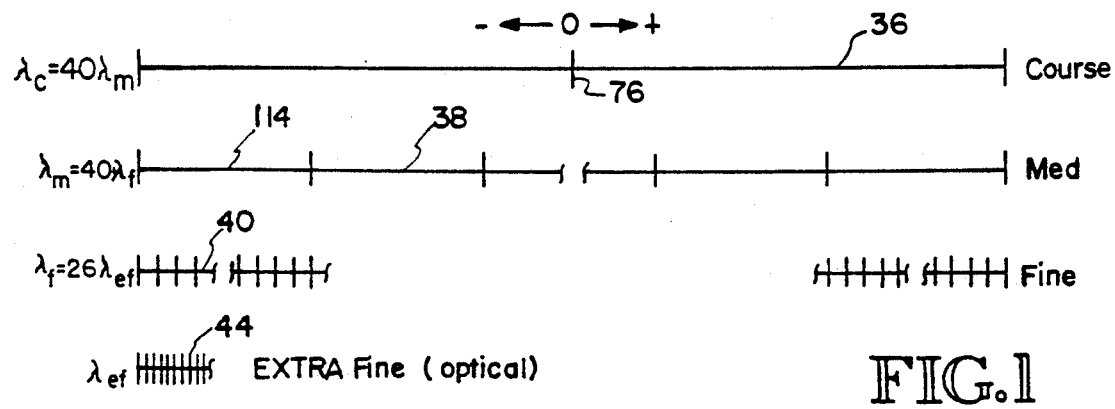
FIG. 1 is a schematic representation of different mensuration resolutions achieved by coarse, medium, fine, and extra fine measurement modes of the present invention.

An understanding of the overall system 20 is best obtained by reference to FIG. 1, in which four modes of operation, coarse 36, medium 38, fine 40, and extra fine or optical 44 are shown. These four modes represent relative spatial wavelengths that each of the system's modes of operation utilize.

The extra fine mode of operation is achieved by an optical subsystem of the invention generally indicated by Reference No. 46 in FIG. 11. This subsystem is capable of determining the relative positions of the scale 22 and transceiver 34 to within approximately ±1 μm within an optical wavelength of 40 μm. However, to ultimately determine the absolute relative position of the transceiver and scale within a full-scale range of 1664 mm, the optical subsystem relies on information received from a capacitive subsystem, generally indicated at Reference No. 48 in FIG. 11 of the overall system 20.

Each mode in FIG. 1 has a spatial wavelength which is many times greater than the next finer adjacent mode. Thus, the extra fine or optical mode has a wavelength of 0.040 mm and an accuracy of approximately 1 μm, the fine mode has a wavelength of 1.040 mm and an accuracy of approximately ±15 μm, the medium mode a wavelength of 41.6 mm and an accuracy of approximately ±0.4 mm, and the coarse mode 36 a wavelength of 1.664 m and an accuracy of ±15 mm. The modes 36–44 shown in FIG. 1 are not all actually printed on the scale 22, but represent spatial wavelengths which an electronic processing subsystem, generally indicated at Reference No. 50 in FIG. 11, synthesizes and utilizes to determine the relative location of the transceiver 34 with respect to the scale 22.

For the capacitive subsystem 48, there are forty such groups of higher resolution wavelengths within each group of coarser resolution. Thus, the coarse mode 36 encompasses forty medium modes or wavelengths 38, while each medium mode encompasses forty fine modes or wavelengths 40, and each fine mode encompasses twenty-six extra fine modes or wavelengths 44. By knowing the relative location of the transceiver 34 with respect to the scale 22 within each of the extra fine, fine, medium, and coarse modes or scale shown in FIG. 1, the absolute relative position of the transceiver 34 with respect to scale 22 (i.e., the position of the transceiver with respect to the overall scale 80) is known to within the resolution of the extra fine mode 44 (i.e., 1 μm).

CAPACITIVE SUBSYSTEM

An understanding of the method by which the capacitive subsystem 48 in FIG. 11 transmits signals between the scale 22 and transceiver 24 is obtained by reference to FIGS. 2–6 and 11. The coarse mode of operation, followed by the medium and fine modes, are described hereinbelow. The capacitive subsystem is substantially similar to the system described in U.S. Pat. Nos. 4,879,508 and 4,878,013, which are incorporated herein by reference.

Figure 2:
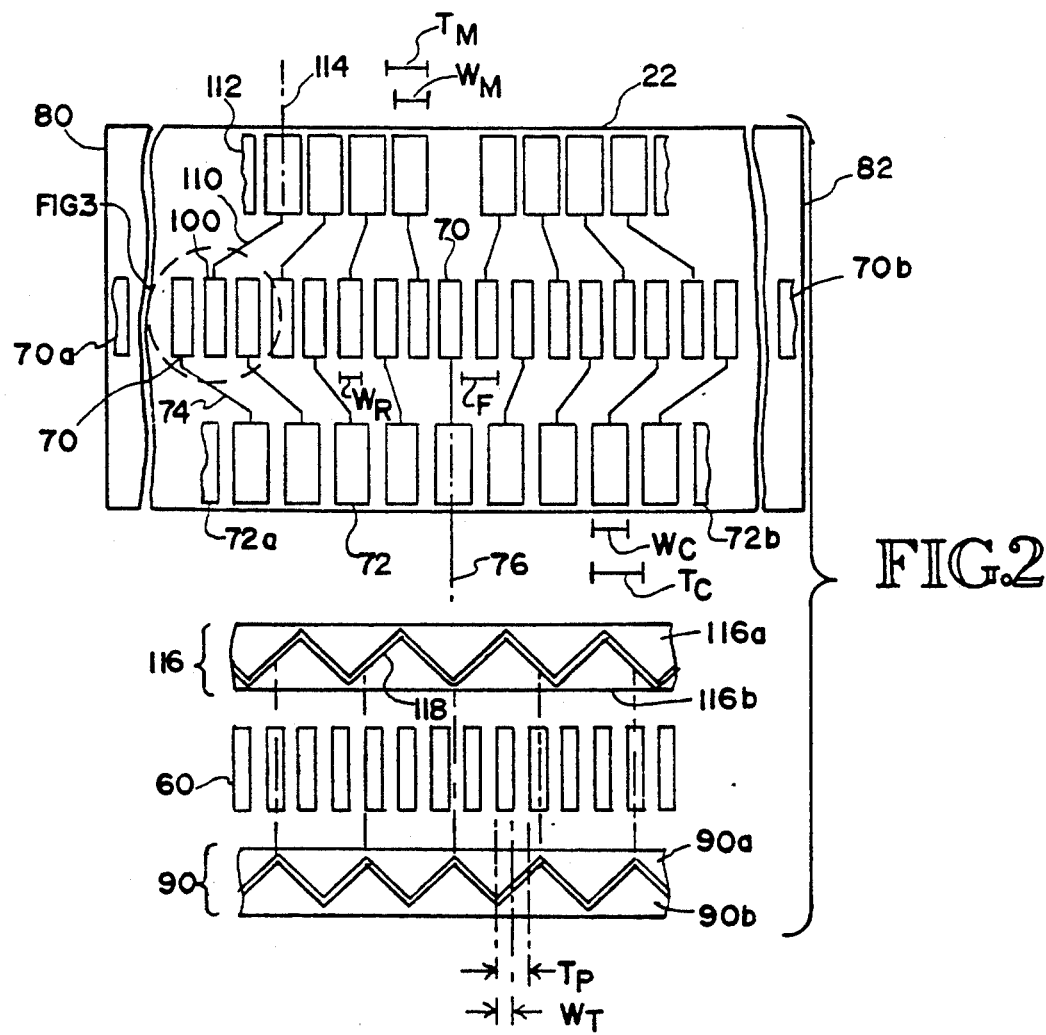
FIG. 2 is a schematic representation of the structure and relative positioning of a fixed scale and moveable pick-off or transceiver of the present invention.
Figure 4:
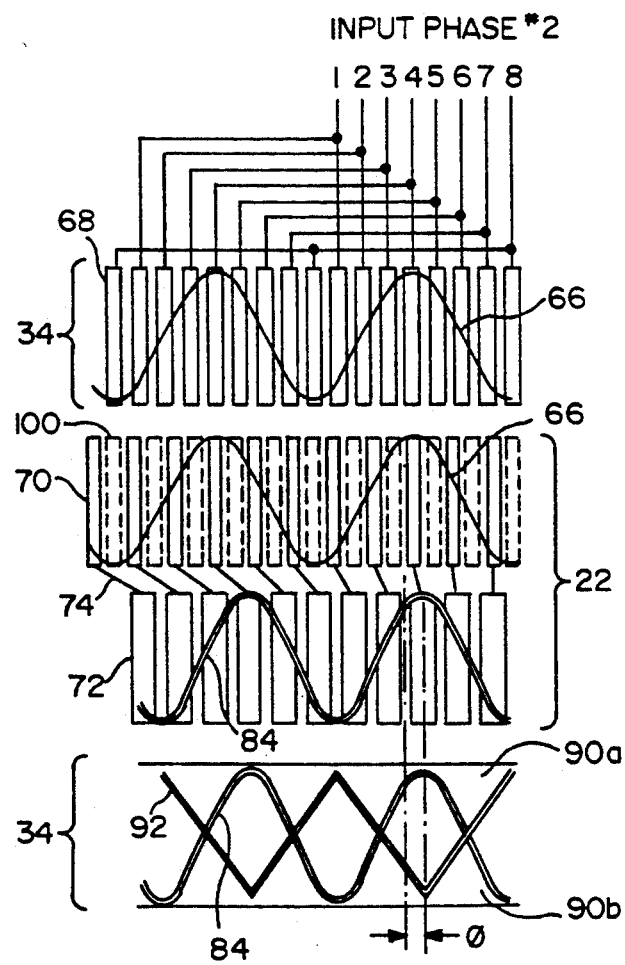
FIG. 4 is a schematic representation of a simulated electronic wave transmitted from the transmitter electrodes on the moving pick-off to receiver electrodes on the scale, which is then physically compressed by electrical connections from the receiver electrodes on the scale to transfer electrodes on the scale, which is then capacitively transmitted to receiver electrodes on the pick-off for determination of an electronic phase shift representing relative, position.
Figure 6:
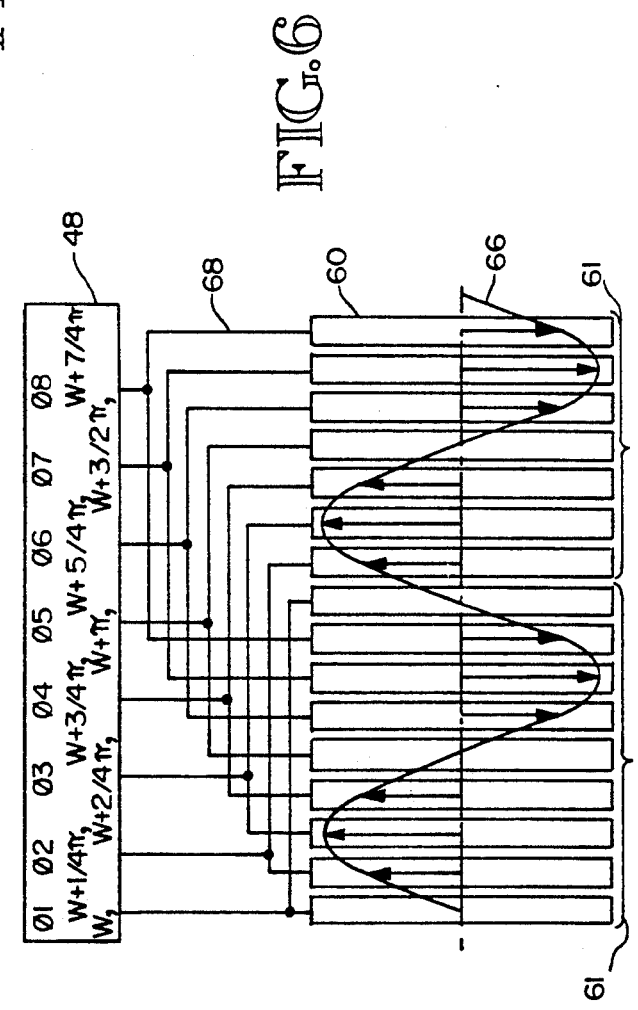
FIG. 6 is a schematic representation of the manner by which a simulated electronic wave is generated on pick-off scale electrodes.

As shown in FIG. 10, the scale 22 and transceiver 34 are positioned in a substantially parallel relationship such that the transceiver moves across the front surface 32 of the scale with the car 26 in a linear fashion, separated from the scale by a small gap. FIGS. 2 and 4 illustrate the scale and transceiver positioned side by side, having been separated with their adjacent faces in top plan view. The transceiver 24 is provided longitudinally along its center with a plurality of transceiver transmitter electrodes 60 electronically excited in groups of eight 61, as shown in FIG. 6. The transceiver transmitter electrodes 60 each have a width of approximately 0.416 mm and an on-center separation distance (or transmitter pitch) of 0.650 mm so as to form a gap between the transceiver transmitter electrodes of approximately 0.234 mm.

Each electrode is provided with an electrical signal by the capacitive subsystem 48 with a differing voltage amplitude such that an interrogating signal 66 of sinusoidal amplitude appears across the group of eight transmitter electrodes. The signal is modulated by an electronic processing subsystem 50 in FIG. 11 to simulate an electronic wave throughout the length of the transceiver 34.

Figure 5:
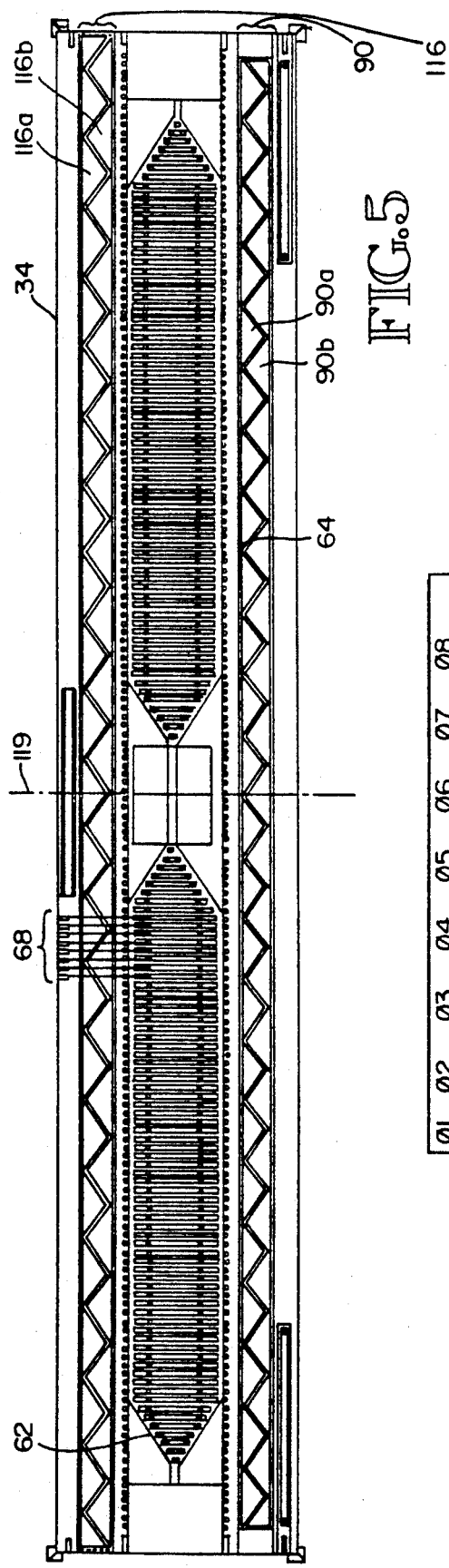
FIG. 5 is a top plan view of the pick-off or transceiver.

As will be described further below, nine groups 61 of eight transmitter electrodes forming a transmitter group 62 are provided on the pick-of 34, shown in FIG. 5, and two of these groups are provided on opposites sides of an optical transducer 64 for purposes which will be explained further below. The interrogating signal is represented by interrogating wave 66 in FIGS. 4 and 6. Electrical connections 68 repeat the sinusoidal signal throughout the length of the transmitter group 62.

Figure 3:
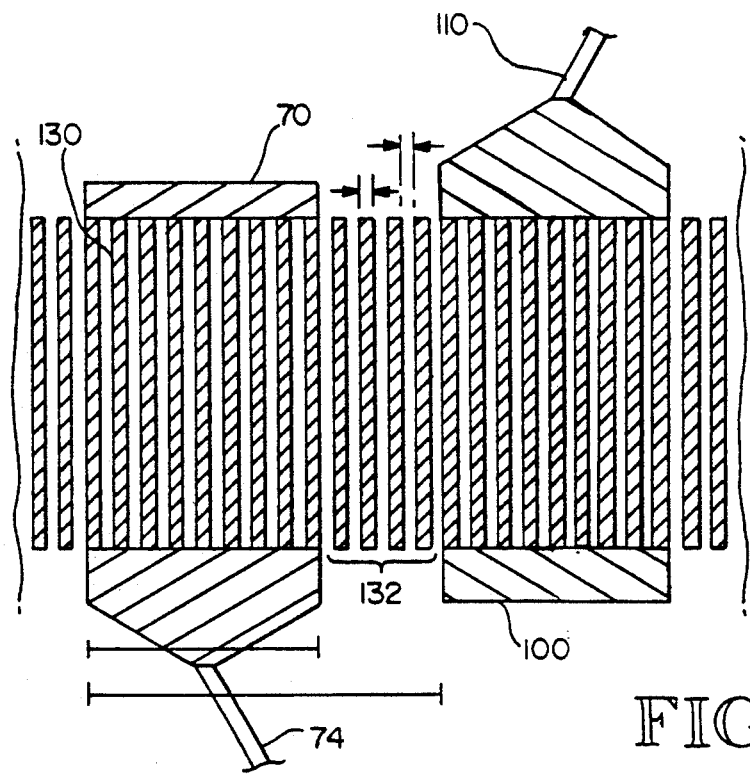
FIG. 3 is an enlarged, schematic representation of the circled area 3 in FIG. 2.

As shown in FIGS. 3 and 4, the scale 22 has a first group 70 of scale receiver electrodes (represented by solid lines) which are positioned parallel and adjacent to the transceiver transmitter electrodes 60 when the scale and transceiver are positioned in registration with one another, as shown in FIG. 10. The interrogating wave 66 is therefore capacitively coupled across the small gap between the scale and transceiver so as to impress similar simulated electronic wave interrogating signal 66 upon the first group of scale receiver electrodes 70.

The first group of scale receiver electrodes have a group electrode width of approximately 0.340 mm, and are alternately routed to the medium and coarse sides of the scale to provide an on-center spacing for coarse group electrodes (or receiver electrodes pitch) of exactly 1.040 mm to form a gap between alternate scale receiver group electrodes of 0.700 mm.

The interrogating wave 66 is electrically transferred in a direction transverse to the longitudinal axis of the scale 22 to a lower group of coarse transfer electrodes 72 by electrical connections 74 such as metallized lines which have been etched onto the scale 22 substrate. As can be seen from close inspection of the lower portion of scale 22 in FIG. 2, only along a coarse scale center line 76 of the scale does a scale receiver electrode 70 of the first group line up directly above a coarse transfer electrode 72. If the scale is viewed to the left or right of this coarse center line, coarse transfer electrodes appear to be more and more displaced (towards coarse center line 76) as one moves further away from the coarse center line. This result occurs because the coarse transfer electrodes 72 have an on-center spacing (pitch) of 1.037 mm, slightly smaller than the coarse scale receiver electrode 70 pitch of 1.040 mm. The two groups of electrodes only line up at the center of the scale 22 at coarse scale center line 76. This can represent the origin of the coarse mode 36 in FIG. 1. The scale 22 has a length of 1.664 meters, and thus contains 1,600 of the scale receiver electrodes 70 of the first group type. Thus, 1,605 coarse transfer electrodes 72 would fit into the same space. However, the same number of coarse transfer electrodes (1,600) are provided on the scale with the slightly smaller on-center spacing of 1.037 mm, with only the scale receiver electrode 70 at the coarse scale center line 76 being aligned directly above a coarse transfer electrode 72. As a result, at the opposite ends 80, 82 of the scale 22, the electrical signals present on the scale end receiver electrodes 70a, 70b receive the greatest inwardly shift when transferred to the end coarse transfer electrodes 72a, 72b. It is therefore apparent that when the transceiver 34 is positioned so as to be centered directly above coarse scale center line 76, the interrogating wave 66 experiences the least amount of displacement by the scale electrode connections and the interrogating wave experiences the greatest displacement by the scale electrode connections at the ends 80, 82 of the scale.

An example of electronic wave displacement between the scale receiver electrodes 70 and coarse transfer electrodes 72 is shown in FIG. 4. Although exaggerated in the Figure, this resulting wave displacement on the scale is dependent on the degree of displacement of the transceiver 34 from the zero position 76 of the coarse scale mode. As seen in FIG. 4, this displacement can be interpreted as a spatial phase shift appearing in the shifted wave 84 compared to the interrogating wave 66. Although the interrogating signals generated on the transceiver transmitter electrode 60 may be a time varying wave, the interrogating wave 66 and shifted wave 84 of FIG. 4 are shown as a standing wave so that the resulting spatial phase shift is more readily apparent. It may then be seen that the spatial phase shift induced by the scale electrode configuration is a unique function of the relative position of the scale and transceiver.

The capacitive subsystem 48 in FIG. 11 merely measures this spatial phase shift, which is indicative of the degree of displacement of the transceiver 34 from the origin 76 (i.e., center) of the coarse scale mode 36. This technique is particularly advantageous because it is not necessary to "count" the number of scale receiver electrodes 70 which have been passed over by the transceiver due to displacement of the transceiver from the origin 76 of the coarse mode. The preferred electronic device, integrated circuit model number MN064 manufactured by Mitutoyo Corporation of Japan, indicated at Reference No. 61, can quickly convert this phase shift number into a position measurement. Thus, with limited accuracy, the capacitive subsystem 48 knows the relative position of the scale 22 and transceiver 34 even if the transceiver is moved rapidly, or if power to the system is interrupted or disrupted, such as by a transient power spike.

In order to determine the spatial phase shift described above, the phase shifted signal 84 appearing on the coarse transfer electrodes 72 must be compared to the original, interrogating wave 66 generated on the transmitter electrodes 60 of the transceiver 34. As shown in FIGS. 2 and 4, the transceiver is provided with coarse receiver plates 90a, 90b which are separated by a small gap 92 which establishes a periodic structure of wavelength 5.184 mm, the same as the shifted signal 84. The coarse receiver plates capacitively couple the shifted wave 84 from the coarse transfer electrodes 72 back to the transceiver 34 but, because of their periodic structure, they also will modify the temporal phase shift of the shifted signal 84, relative to the interrogating wave 66. The relative temporal phase shift of the interrogating wave 66 generated on the transmitter electrode 60 and the shifted wave 84 appearing on the coarse receiver plates represent displacement because the coarse receiver plates and their spatial filters move precisely with the transmitter electrodes on the transceiver 34. It is to be remembered that the interrogating wave 66 and shifted wave 84 may not be truly stationary sinusoidal waves, but are merely representative of the voltage amplitude of each given instant in time. Thus, as shown in FIG. 4, the shifted wave 84 (representing the positive and negative voltage amplitudes appearing on the adjacent coarse transfer electrodes 72) impresses a charge on the coarse receiver plates which is a proportional to the product of the coarse transfer electrode voltage and the area overlayed by the respective coarse receiver plate. Thus, for the shifted wave 84 shown in FIG. 4 on the coarse receiver plates (shown with exaggerated shift in the connections, for clarity), there is a large amount of positive charge impressed on the upper coarse receiver plate 90a. If the transceiver were positioned approximately over the origin 76 of the scale, then shifted wave 84 in FIG. 4 would appear to have shifted to the left (it would be nearly aligned with the wave 66). Thus, less of the relatively positive-voltage from the coarse transfer electrodes 72 would be positioned to overlay the upper coarse receiver plate 90a, while more of the negative voltage phase signals from the coarse transfer electrodes 72 would be positioned to overlay the upper coarse receiver plate 90a. As a result, the phase sum of the area-weighted phase voltages impressed upon this receiver plate would differ from the sum of the area weighted phase voltages impressed upon this receiver plate 90a as shown in FIG. 4. This difference is a function of the relative displacement of the shifted wave 84 and the receiver plate 90a. The area-weighted sum of the phase voltages is equal to a temporal phase shift between the signal output on the plate 90a and the interrogating signal. This is interpreted by the capacitive processing system 61 and converted into a displacement number with an accuracy of approximately ±15.6 mm, or better.

The medium mode 38 of FIG. 1 operates in exactly the same fashion, except that interrogating waves 66 (FIG. 4) on the transceiver transmitter electrode 60 (FIG. 2) are received by a second group of scale receiver electrodes 100, represented by dashed lines in FIG. 4. The individual scale receiver electrodes of this second group have the same size and pitch as the scale receiver electrodes 70 of the first group. As shown in FIG. 2, these receiver electrodes of the second group are merely interleaved between the electrodes of the first group and are electrically connected by electrical connectors 110 to a plurality of medium transfer electrodes 112 The medium transfer electrodes have a slightly narrower width (0.890 mm) than the width (1.000 mm) of the coarse transfer electrodes 72, and are spaced at an on-center distance (pitch) of 0.924 mm.

If the center of these medium transfer electrodes were to line up directly above the second group of scale receiver electrodes 100, forty-five of these transfer electrodes would fit in the space occupied by 40 of the scale receiver electrodes of the second group. However, only forty such medium transfer electrodes are positioned in this space, with a center one in this group of forty medium transfer electrodes positioned directly above one of the second group of scale receiver electrodes 100. (See center line 114 in FIG. 2.) This group of forty scale receiver electrodes 100 and medium transfer electrodes 112 forms one of the medium scale wavelengths 38 shown in FIG. 1. Thus, the interrogating wave 66 will experience no displacement when transferred to a group of medium transfer electrodes if the transceiver 34 is aligned above the origin 114 (see FIG. 1) of a medium transfer electrode group. As the transceiver 34 is shifted from this zero position, the displacement between the interrogating wave 66 and the shifted wave 84 becomes greater. In the medium mode, medium receiver plates 116a and 116b are positioned adjacent to the transmitter electrodes 60 on the transceiver 34, except that they are positioned on the opposite side of the transmitter electrodes 60 from coarse receiver plates 90a, 90b. The periodicity of the pattern formed by the gap 118 between the upper and lower plates is slightly different than the periodicity of the pattern formed by the gap 92 in the coarse receiver plates 90. Specifically, the coarse receiver plates have a pattern formed by the gap 92 which repeats every 5.184 mm, while the medium receiver plates 116 have a pattern formed by the gap 118 which repeats every 4.622 mm. Each of these patterns is centered with respect to the longitudinal center 119 of the transceiver 34, as shown in FIG. 5.

The manner by which the shifted wave 84 is capacitively coupled from the medium transfer electrodes 112 to the transceiver 34 is similar to the method by which the shifted wave 84 is capacitively coupled from the coarse transfer electrodes 72 in scale 34. As a result, the phase difference between the signal on receiver plate 116a and the interrogation signal is a function of the relative displacement of the shifted wave on medium transfer electrodes 112 and the receiver plate 116a. The capacitive processing system 61 of FIG. 11 converts this phase shift into a displacement number with an accuracy of approximately ±0.39 mm.

The fine mode 40 of operation operates substantially differently from the coarse mode 36 and the medium mode 38. Examination of FIGS. 2 and 3 shows that the on-center distance between adjacent scale receiver electrodes of the first group 70 and second group 100 is 0.520 mm, whereas the on-center spacing for the transceiver transmitter electrodes 60 is about 0.650 mm.

As disclosed in the applicants U.S. Pat. No. 4,878,013, incorporated herein by reference, regarding the arrangement of transmitter electrodes 60, the measurement direction width of the individual transmitter electrodes can be significantly increased relative to the scale wavelength by arranging the electrodes so as to define a plurality of electrode groups each having 8 electrodes 60 and each having a uniform group pitch T=5.200 mm (defined as the edge-to-edge distance between the initial electrodes in adjacent groups) that is a multiple of the scale wavelength. Within each electrode group, electrodes 60 are positioned and electrically connected so as to respectively occupy 8 group positions which are spread over a distance greater than one scale wavelength, and each of which corresponds to the relative position of a different one of a set of relative wavelength segment positions obtained by dividing the distance spanned by an electrode group into intervals corresponding to the scale wavelength, and dividing each interval into 8 equal segments. Advantageously, the group electrodes are distributed over the entire measurement direction width of the group such that at least one electrode 60 is positioned in each interval of the group. For the fine operation mode the 1-2-3-4-5-6-7-8 phase sequence 48, FIG. 6, is reconfigured by switches in the MN064 IC 61, to the relative sequence 1-6-3-8-5-2-7-4 of relative wavelength segment positions, to accomplish the desired electrode configuration.

In accordance with the present invention, the eight signal generator output signals are connected to electrodes 60 of each electrode group in the same 1-6-3-8-5-2-7-4 sequence. As a consequence of the fine transmitter electrode arrangement of the present invention, the individual receiver electrodes 70 and 100 receive signals from the transmitter electrodes 60 that are uniquely different depending on which part of the transmitter array is disposed opposite the scale receiver electrodes. In fine mode the receiver electrodes 116a and 116b are connected together, and the receiver electrodes 90a and 90b are connected together. Since the receiver electrodes 116 or 90 do detect, via transfer electrodes 112 or 72 respectively, the sum of all of the signals produced by the receiver electrodes which are in opposing relationship with the transmitter electrodes, as determined by the position of transceiver 34 relative to scale 22, the resulting signals on the receivers 90 and 116 vary with the relative positions of the transceiver 34 and scale 22 with a wavelength of 1.040 mm. The signal on receiver 90 is 0.520 mm out of phase with the signal on receiver 116.

The capacitive processing system 61 can therefor measure the temporal phase difference between the signals on receivers 90 and 116, and a reference phase signal which is conveniently a specific one of the transmitted phases 48, and convert this phase measurement to a displacement number, with an accuracy of approximately ±0.015 mm. The capacitive processing system can make this measurement to within ±15 μm because the scale electrodes are accurately placed, and the internal electronics of the MN064 integrated circuit 61 can distinguish the phase shift of the signals appearing on the receiver plates 90 and 116, relative to the transmitter reference phase signal, with a very high degree of accuracy.

OPTICAL SUBSYSTEM

Although the capacitive processing system 61 is theoretically capable of greater accuracies than those described above, fabrication costs and other practical design considerations are less favorable when the electrodes 70 and 100 are spaced substantially more closely than 0.520 mm as shown in FIG. 3. Optical systems do not suffer such drawbacks at narrow scale element spacings because optical patterns may be projected through large gaps, and do not depend on small gaps and "large" element surface area to achieve strong signals.

The absolute position system 20 of the present invention is therefore provided with an optical subsystem generally indicated at reference numeral 46 in FIG. 11. The optical subsystem employs an optical pattern integrated into the scale 22, as shown in FIG. 3. FIG. 3 shows an enlarged area circled in FIG. 2.

Each scale receiver electrode of the first group 70 and second group 100 is provided with nine optical stripes 130 of reflective material such as metal. These stripes may be deposited on the scale such as by photolithography. In addition, groups of four optical stripes 132 are provided between the scale receiver electrodes of the first and second groups to form a continuous optical grating. Each stripe has a width of 0.020 mm, and a gap of 0.020 mm is provided between each stripe. Thus, the on-center separation of the stripes is 0.040 mm. As previously stated, the transducer 34 is provided with an optical transducer 64 which interacts with the optical stripes 130, 132 on the scale 22. The optical transducer 64 feeds optical measurement signals to an optical signal amplifier system 140 and an optical processing system 142 for combination with data from the capacitive processing system 61 in an "optical storage register" 144. Each of these elements are described in further detail below.

It is sufficient for the present purposes of discussion to indicate that the optical subsystem 46 and optical storage register 144 have the ability to count the number of optical stripes which the transducer 34 has passed over during its travel from an arbitrary starting position, such as the origin 76 of the coarse mode. The optical subsystem 46, through a means such as common quadrature signal interpolation, has the ability to determine (between any two adjacent optical stripes 130) where the transducer is within an error margin of approximately ±1 μm. In order to prevent the optical storage register count from becoming inaccurate if transducer 34 is moved too quickly for the optical memory to "keep up" with the count, the capacitive absolute position data (within an error of approximately ±15 μm) is used to update the capacitive position data in the optical storage register 144 to within the accuracy of the capacitive subsystem 48. Thus, with the optical wavelength ambiguity removed, an overall absolute position measurement to within an error margin of ±1 μm is always available at output 146 of the optical storage register (see FIG. 11).

Table A summarizes all of the relevant distances and measurements set forth above and in the figures.

TABLE A

| Wavelengths/pitches: Scale: | |
|---|---|
| F - FINE wavelength: | 1.040 mm |
| M - MEDIUM wavelength: | F*40 = 41.600 mm |
| C - COARSE Wavelength: | F*1600 = 1664.000 mm |
| Tm - MEDIUM transfer electrode pitch: | F*40/45 = M/45 = 0.924 mm |
| Tc - COARSE transfer electrode pitch: | F*1600/1605 = C/1605 = 1.037 mm |
| I - OPTICAL bar pitch | 0.040 mm |
| Rs - Scale receiver electrode pitch: | F*1/2 = .520 mm |
| Pickoff: | |
| T - Transmitter wavelength: | F*5 = 5.200 mm |
| Tp - Transmitter electrode pitch: | F*5/8 = 0.650 mm |
| Mr - MEDIUM receiver electrode wavelength: | T*40/45 = 4.622 mm |
| Cr - COARSE receiver electrode wavelength: | F*1600/321 = T × 1600/1605 = 5.184 mm |
| Electrode Widths: Scale: | |
| Wo - Optical Bar: | 0.020 mm |
| Wr - Receiver electrode (9 optical bars = F/3): | 0.340 mm |
| Wm - Transfer electrode (MEDIUM side): | 0.890 mm |
| Wc - Transfer electrode (COARSE side): | 1.000 mm |
| Pickoff: | |
| Wt - Transmitter electrode | F*2/5 = 0.416 mm |
| Lengths: | |
| Transmitter length: | T*11 = Tp*88 = 57.200 mm |
| Receiver electrode length (MEDIUM side): | M + Mr = Mr*10 = 46.222 mm |
| Receiver electrode length (COARSE side): | Cr*9 = 46.647 mm |

As best seen in FIG. 7, the optical transducer 64 includes a light-emitting diode (LED) 150 and four phototransistors 152, 153, 154, 155. A suitable LEO is Hitachi part number HE 8807 SG. A suitable phototransistor is Panasonic part number PN 168. Both of these parts are commercially available. The LED 150 emits a substantially monochromatic beam of light through a source grating 156. The source grating includes fifteen optical stripes 158, each having a width of 60 μm with a transparent gap of 20 μm between adjacent optical stripes. Thus, the opaque stripes first grating 156 have an on-center spacing of 80 μm. The die (not shown) of the LED 150 is positioned at a preferred gap distance 160 of 4.447 mm from the source grating.

The receiver gratings also have optical stripes 158 with a 50% duty cycle, the same periodicity as the optical stripes of the source grating, except that the lateral center of the patterns in the receiver gratings are shifted by one-fourth (90° phase shift) and one-half (180° phase shift) of the optical signal wavelength, as will be described more fully below, to provide a spatially filtered self-image signal from the optical stripes 130, 132 of the scale 22 at the phototransistors 152 to 155, with a characteristic optical signal spatial phase shift determined for each receiver grating and phototransistor.

As previously stated, the optical stripes 130, 132 have a periodicity of 40 μm, while the optical stripes 158 in the source and receiver gratings have a periodicity of 80 μm. The gap distance 162 has been selected to provide a high-contrast self-image. The self-image of the scale reflected back onto the receiver gratings will be magnified to exactly double the scale pattern dimensions, for an optical self-image wavelength of 80 μm. The reflected image periodicity therefore matches the spacing of the stripes in the receiver gratings.

An optical position determination occurs as follows. The receiver grating 165, for example, can be positioned (by movement of the transceiver 34) at a lateral location with respect to the scale 22 in which the "reflected" self-image of the optical stripes 130 are directed onto the opaque optical stripes 158 of receiver grating 165. In this relative position, the corresponding phototransistor 152 will not receive any reflected light from the scale. As the transceiver 34 is laterally displaced from this position, the reflected image of the optical stripes 130 will no longer be aligned with the opaque optical stripes 158 of the receiver grating 165 and some reflected light will be received by the phototransistor 152. When the reflected image of the stripes 130 are fully in between the opaque optical stripes 158, a maximum signal is received by the phototransistor 152. As the transceiver 34 moves away from this position of maximum signal, the signal received by the phototransistor 152 will gradually fall to a minimum.

A graph of the signal conditioned output of the phototransistor 152 is shown in FIG. 8 as sinusoidal wave form A. Note that at an amplitude output from the phototransistor 152 of 1.8, there are two position values 170, 172 which correlate to this amplitude. To determine which of these two data points is the correct position, receiver grating 168 is provided with a pattern which is shifted in space from the mean position of the receiver grating 165 with respect to the source grating by an integer number plus one-fourth of the spatial wavelength of the scale image at the plane of the detector, i.e., an optical signal phase shift of 90°. A graph of the output of the phototransistor 155, which receives an amplitude signal through receiver grating 168, is shown in FIG. 8 as sinusoidal wave form B. Study of the wave forms at data points 170, 172 shows that corresponding unique values 174, 178 of the output amplitude of the phototransistor 155 appear on wave form B. Thus, a unique position for the transceiver 34 with respect to the scale 22 can be obtained by monitoring the outputs of phototransistors 152 and 155. This is a well-known "quadrature signal" detection scheme.

In order to maximize the signal available to the optical signal amplifiers 140 and to minimize common mode errors in the amplifiers, receiver gratings 166 and 167 are provided. These receiver gratings have opaque optical strips with the same width and periodicity as do the optical strips of receiver gratings 165 and 168. However, the positioning of the optical strips 158 of receiver grating 166 is spatially 180° of the optical self-image signal out of phase with the positioning of the optical strips in source grating 165. Similarly, the position of the optical strips in receiver grating 167 is spatially 180° of the optical self-image signal out of phase with the positioning of optical strips in receiver grating 168. A graphical representation of the outputs of phototransistors 153 and 154 which are associated with the receiver gratings 166 and 167, respectively, are shown in FIG. 8 as a sinusoidal wave forms NOT A and NOT B.

Considering practical fabrication and assembly dimensions, and readily available component sizes for the LED 150 and the phototransistors 153–155, the preferred nominal lateral displacement of the receiver gratings from the center of the source grating(s) is approximately 2.385 mm. This can be considered to be the center of the receiver window "A" 165.

For establishing the quadrature signals, A, B and their complements NOT A, NOT B, the appropriate spatial phase shifts of the receiver gratings 166 through 168 are achieved by displacing the lateral position of the centers of the identical receiver pattern windows, from the chosen position of receiver window 165, by an integer number of optical self-image wavelengths (to bring them to a nominal lateral position of very roughly 2.38 mm from the center of the source gratings(s)), plus an appropriate additional portion of an optical self-image wavelength which provides the proper quadrature signals.

Thus, the lateral displacement of the receiver grating 168 (which generates the "B" signal) has its center laterally displaced from the center of the receiver grating 165 by 4.800 mm plus 20 $\mu$m ($\frac{1}{4}$ times the optical self-image wavelength). The grating 168 generates the B signal in FIG. 8 which is 90° of the optical self-image signal out of phase with the A signal. Similarly, the receiver grating 166 which generates the NOT A signal has its opaque optical strips displaced 40 $\mu$m ($\frac{1}{2}$ the periodicity of the stripes in the magnified self-image) from the position of the opaque optical stripes of the receiver grating 165 (the A grating). Similarly, the receiver grating 167 has its optical stripes displaced 40 $\mu$m from the lateral position of the optical stripes in receiver grating 168. In this way, the receiver grating 167 generates the NOT B signal received by the phototransistor 154.

FIG. 7A shows an alternate embodiment of the optical transducer 64 in which the centering of the receiver gratings is the same as that discussed for FIG. 7. However, the receiver gratings are bounded by windows having a lateral width of 1.6 mm and a vertical height of 2.4 mm. The source grating 156 has been masked into four source windows 218 through 221, each having vertical dimensions of 1.2 mm and horizontal dimensions of 0.8 mm. The centers of each of these source windows are displaced horizontally approximately 0.80 mm and vertically approximately 1.2 mm from the center of the original receiver grating 156. This configuration tends to eliminate rays with excessive differences in optical path length from the LED 150 to the various receiver gratings, increasing the useful optical signal at the receiver gratings and phototransistors.

Figure 9:
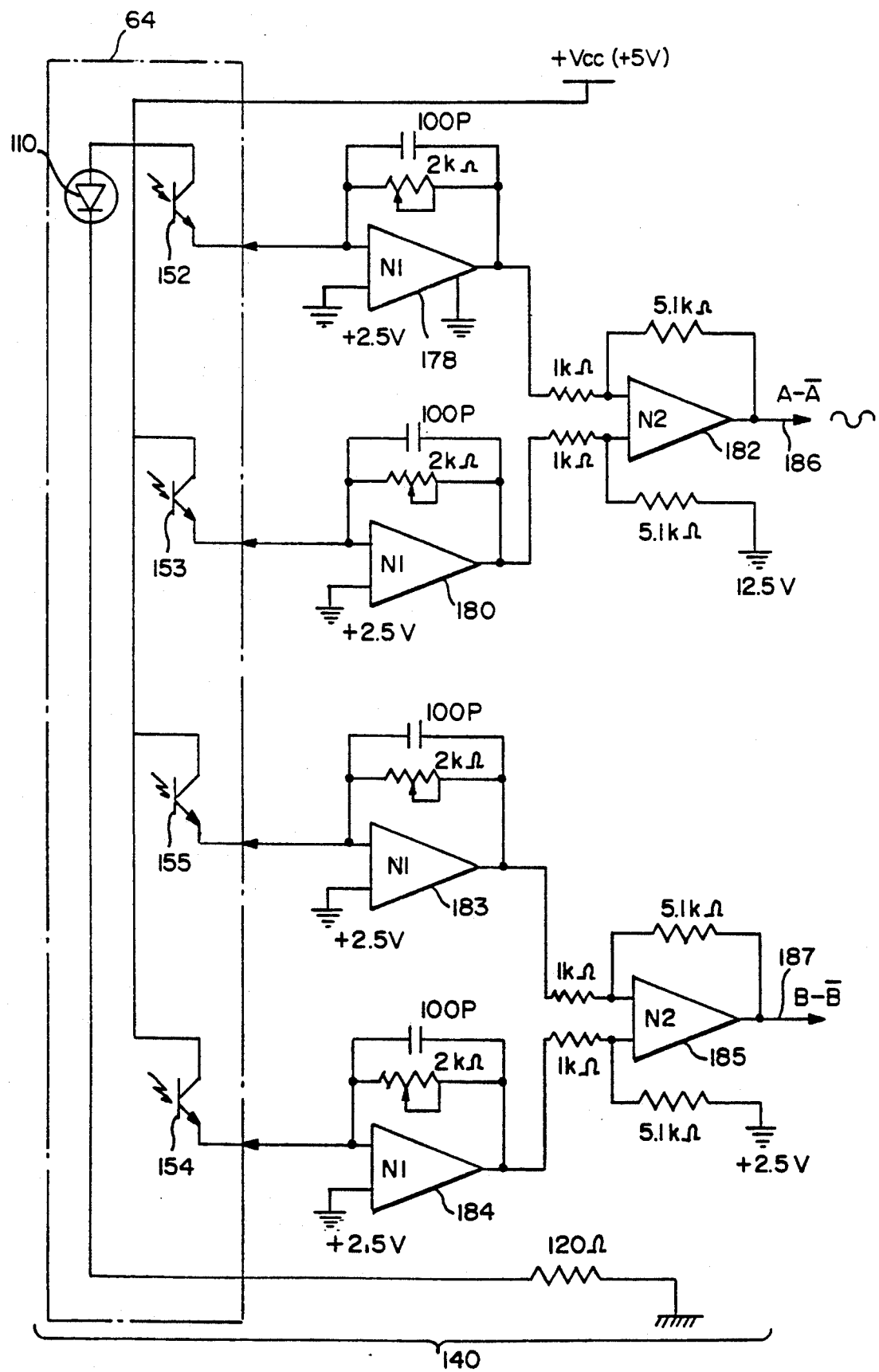
FIG. 9 is an electronic schematic of an amplifier system which amplifies and combines the signals shown in FIG. 8.

As previously stated and as shown in FIG. 11, the optical signals, A, NOT A, and NOT B, are conditioned by optical signal amplifier 140 in FIG. 11. FIG. 9 illustrates the circuitry of the optical signal amplifier.

As shown in FIG. 9, the signals from phototransistors 152 and 153 (A, NOT A0, are fed in the inverting inputs of operational amplifiers 178, 180. These amplified signals are then directed into an operational amplifier 182 configured as a difference amplifier. The non-inverting inputs of each of these operational amplifiers is referenced to 2.5 volts so that the phototransistors operate in a substantially linear region.

Signals from the phototransistors 154, 155 are also amplified by a pair of operational amplifiers 183, 184. These amplified signals are then fed into a difference amplifier 185 to provide an output signal 187 which is 90° out of phase with the output signal 186 of difference amplifier 182.

The outputs 186, 187 are signals which vary in amplitude as a sinusoidal function of the position of the transceiver 34 which respect to the scale 22. The appropriate measurement and interpolation of these signals to achieve high resolution digital displacement and position signals are achieved by the optical processing system 142. A suitable optical processing system is an integrated circuit Model No. MN 102, manufactured by Mitutoyo of Japan.

As shown in FIG. 11, the optical processing system 142 generates a parallel, 6-bit word 210 in which the least significant bit represents a displacement of 1 $\mu$m. The capacitive processing system 61 controls the capacitive transducer and provides position information to the microprocessor 214 via the command and data bus 212 with a position resolution of approximately 2 $\mu$. The microprocessor 214 generates a 16-bit absolute position word in which the least significant bit represents an increment of 40 $\mu$m. The 6-bit optical word is fed directly into the optical storage register 144, as is the 16-bit capacitive word. The microprocessor transmits the capacitive position 16-bit word and directs operation of the optical storage register 144, through a data and command signal bus 216.

ELECTRONIC PROCESSING SUBSYSTEM

As shown in FIG. 11, and as stated previously, the electronic processing subsystem accepts capacitive position data originated by the coarse 36, medium 38, and fine 40 modes of the capacitive subsystem 48 into a microprocessor 214 for processing. A suitable microprocessor is a model 80C51 available from Intel, Inc., Santa Clara, Calif. Position data from the extra fine or optical mode 44 is collected by the optical subsystem 46 and is accepted directly into the optical storage register 144.

The optical storage register performs operations which effectively count all of the optical stripes 130, 132 which the transceiver 34 has passed over in its displacement from the scale origin. It is to be understood that the "origin" of the scale can be mathematically displaced by the microprocessor from the zero 76 of the coarse mode to either end of the scale 22. The optical position data is only reliable with respect to the six least significant bits of the total 24-bit data word in the optical storage register 144. These six least significant bits only refer to the position within one 40 $\mu$m spacing between adjacent optical stripes 130, 132. The next 16 most significant bits represent the gross position data from the coarse, medium, and fine modes and may be continually updated in the optical storage register 144 from the capacitive subsystem 48 by way of the microprocessor 214.

Figure 12:
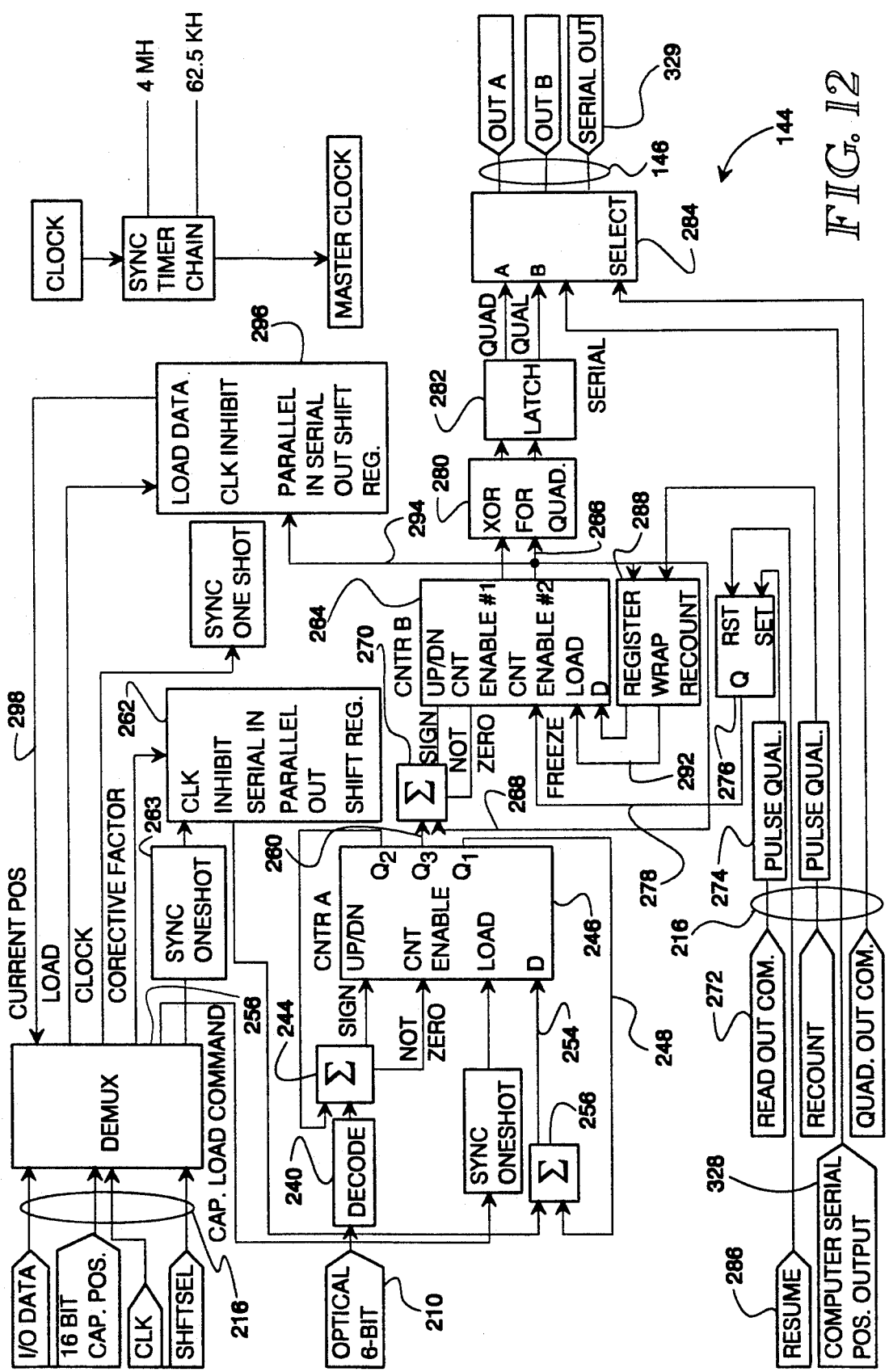
FIG. 12 is a block diagram of the optical position register of the present invention.

As shown in FIG. 12, the optical storage register 144 includes a number of components which combine the optical and capacitive data into a 24-bit absolute position word which is available as either a quadrature or serial output at output 146 of the optical storage register.

A detailed circuit diagram of the optical storage register 144 is shown in FIG. 12. The optical 6-bit output from the optical processing system 142 enters the optical storage register 144 as a 6-bit data word on line 210 at the left of the diagram. As shown in FIG. 12, this output is a coded word in which the first two least significant bits can optionally be used as part of the coded word, or directly, to represent a quadrature output whereas the next four most significant bits are pure binary. This 6-bit word is passed to a conventional decoder 240 which transfers this word into a pure 6-bit binary number. This decoded, 6-bit word is compared in a digital subtractor 244 to an output $Q_2$ of a first displacement counter 246. The digital subtractor 244 compares a previously stored, 6-bit optical position value with the current value emanating from decoder 240. The first counter 246 is incremented or decremented appropriately by subtractor 244 until the optical position stored in counter 246 is equal to the currently measured optical position.

The first displacement counter 246 also stores the next 16 most significant bits which represent the capacitive position from the capacitive subsystem 48 and makes this capacitive data available at output $Q_1$ and on line 248. This capacitive data is added to a correction factor present on line 250 in a digital adder 252. As will be described more fully below, this correction factor is determined by the microprocessor 214 and a corrected, capacitive 16-bit value is loaded to the first displacement counter 246 though line 254. This loading occurs when a command is sent from the microprocessor by way of the demultiplexer 256 and a synchronous one-shot circuit 258. Thus, the first displacement counter 246 contains the absolute position data from the capacitive subsystem 48 and the position within an optical stripe from the optical subsystem 46. This position data has been continually updated and is made available at output $Q_3$ on line 260 at the right side of counter 246 in FIG. 12.

The correction factor which appears on line 250 is delivered from the microprocessor 214 and the demultiplexer 256 through a serial in, parallel out shift register 262 which is enabled by a computer signal passing through another synchronous one-shot circuit 263. To recapitulate, the first displacement counter 246 maintains an updated position value from the optical system which is added to a corrected absolute position value (the sixteen most significant bits only) from the capacitive system through the microprocessor 214. The internal operation of the first displacement counter 246 will be described more fully below. It is sufficient for purposes for this discussion, however, to remember that a 24-bit absolute position number, in which each unit represents a displacement of 1 μm, is present on line 260.

Most machine tool and robotic systems, however, are not presently configured to accept absolute position data in this format. Rather, such systems are configured to accept this data either serially, or in quadrature form. Quadrature data output format is merely a serial countdown of the 24-bit number through two serial signals which are 90° out of phase. To prioritize readout of position data in this form, the optical storage register 144 is provided with a second displacement counter 264 which tracks the value of the first displacement counter 246. This arrangement allows the second displacement counter to be read out to form a quadrature data string on output 146 while the first displacement counter 246 continues to store updated position information.

The above result is achieved by comparing the output of the second displacement counter 264 at node 266 and on line 268 to the output $Q_3$ of the first displacement counter 246 from line 260 in a digital subtracter 270. The digital subtracter 270 increments or decrements the second displacement counter 264 until the number stored therein matches the position number stored in the first displacement counter 246. This tracking action can be frozen, and the value of the second displacement counter read out (upon the receipt of a readout command on line 272).

The readout command passes through a digital pulse qualifier circuit 274 which verifies that the readout command is indeed a digital logic signal rather than a line transient, etc. The readout command is directed to the SET input of a flip-flop 276. The flip-flop then changes its state and sends a logic signal on line 278 to the second displacement counter which freezes a count enable function. An Exclusive OR circuit 280 is connected at node 266 to the two least significant bits in the second displacement counter 264 while the second displacement counter counts down from its current position number to zero. A digital latch 282 connects the Exclusive OR circuit 280 output, and second least significant bit output of counter 264, to an output gating circuit 284 which will be more fully described below.

The Exclusive OR circuit 280 merely comprises an Exclusive OR gate which has its two inputs connected to the two least significant bits of the second displacement counter 264. The output of this Exclusive OR gate becomes quadrature output A. The second least significant bit of the second displacement counter also becomes quadrature output B. As the counter counts down, quadrature output A and quadrature output B will be 90° out of phase as shown in FIG. 11. Once the second displacement counter 264 has fully counted down to zero, the microprocessor 214 sends a resume command on line 286 which is directly connected to the reset input of flip-flop 276. The flip-flop then changes its state which "unfreezes" the second displacement counter 264 and allows the second displacement counter to count back up to the current position number stored in the first displacement counter 246. The first displacement counter has been functioning during the period described above to continuously track the current position of the transducer 34.

A particular problem exists for the second displacement counter 264 which does not exist for the first displacement counter 246. As previously stated, the first six least significant bits represent optical position data with bit $2^5$ representing the sixth bit (allowing reading up to the 40 μm optical scale wavelength). The second displacement counter contains, as does the first displacement counter, a 24-bit register. The largest number storable in a 24-bit binary register is $2^{24}$ minus 1, which equals 16,777,215 in base ten. As each digit represents 1 μm, this number is equal to a displacement of 16.777 m, far larger than the 1.66 m full-scale length of the capacitive system. A digital comparator 288 is therefore provided which does not let the second displacement counter 264 count above (or below) the binary number which represents a full-scale measurement. When this full-scale measurement is encountered, the digital comparator sends a signal on line 290 which loads the next adjacent number (i.e., full-scale minus 1, or 0, depending on which way the transducer 34 is moving) into the second displacement counter 264 on line 292. The digital comparator 288 therefore performs a "register wrap function" to prevent the second displacement counter 264 from over counting. The first displacement counter 246 does not suffer from this problem because the microprocessor 214 is always applying a correction factor on line 250 from the capacitive subsystem 48 which, because of its absolute position determining nature, cannot translate a phase shift into a number greater than a full-scale measurement.

In order to calculate the correction factor which appears on line 250, the microprocessor needs to know the current value of the absolute position number stored in the first displacement counter 246. As this number is also present in the second displacement counter 264, this data is sent by way of 24-bit parallel communication line 294 to a parallel in, serial out, shift register 296 and into the demultiplexer 256 on line 298. The microprocessor then compares the 24 bits of this serial data word to the capacitive data position which the microprocessor has derived from the capacitive processing system 61. If the numbers are different by more than a predetermined acceptable margin, the microprocessor takes this difference, converts it to the nearest integer number of 40 μm increments, and sends it to the digital adder 252 to update the 16 most significant bits stored in the first displacement counter 246.

Figure 13:
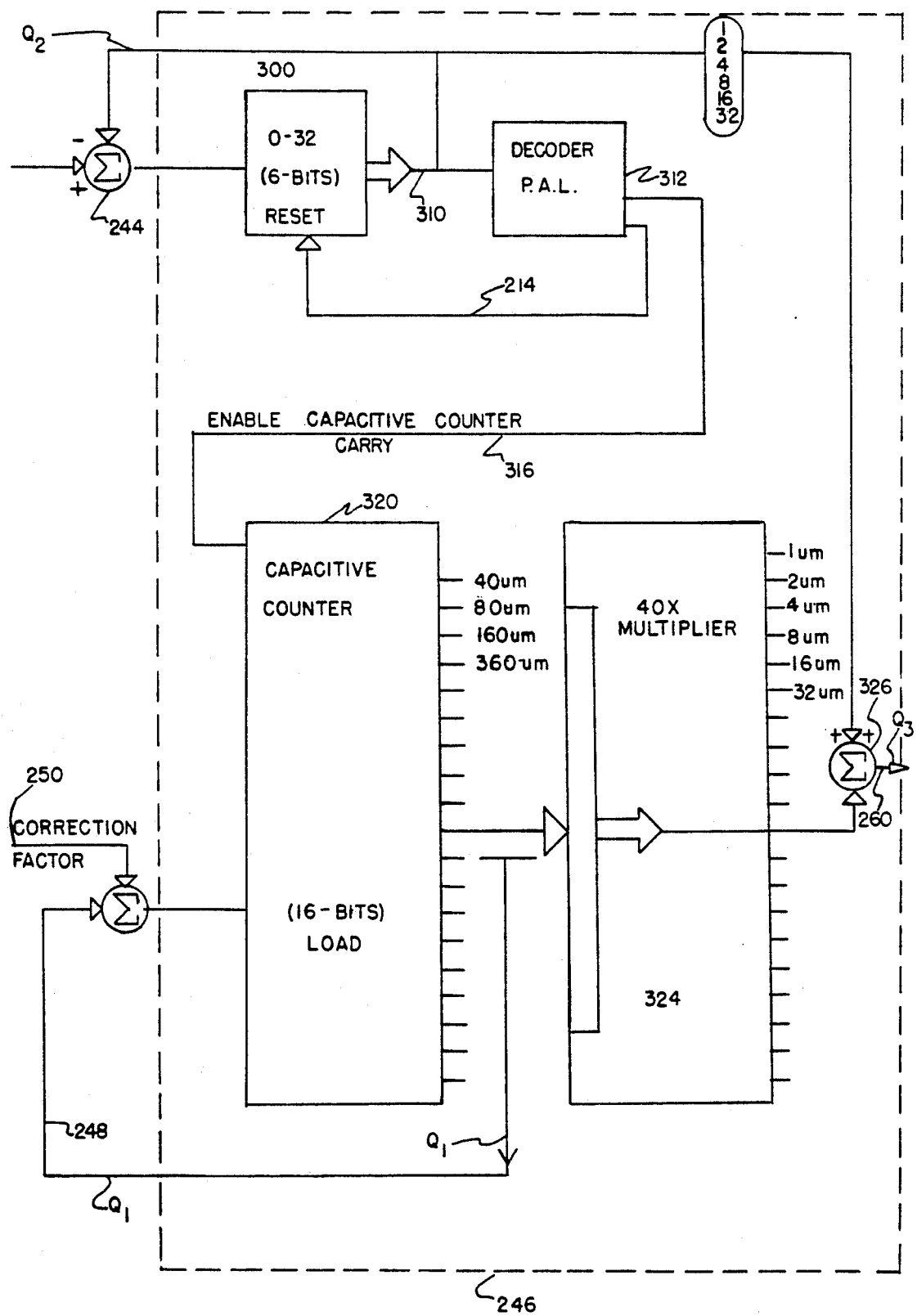
FIG. 13 is an electronic schematic of a first storage register of the optical position register.

As is apparent from the above, the first displacement counter 246 incorporates separate counters for the six least significant bits which represent the optical data, and the 16 most significant bits which represent the capacitive data. FIG. 13 illustrates the internal circuitry of the first displacement counter 246.

The first displacement counter 246 has a 6-bit counter 300 which accepts the pure binary optical data from decoder 240 through the subtractor 244. The binary output 310 (also output $Q_2$, FIG. 12) of this counter is fed into a digital comparator or decoder 312 which resets the counter 300 when the binary counter reaches a decimal number 40. The reset signal is sent on line 214. The digital comparator or decoder 312 also generates a carry bit on line 316 which is fed into the least significant bit 318 of a 16-bit capacitive data register or counter 320. The 16-bit capacitive position word sent by the microprocessor 214 to the optical storage register 144 via the bus 216 assumes that the digital equivalent of each unit in this counter represents 40 μm. Thus, in the counter 320 the least significant bit represents 40 μm, the next most significant bit represents 80 μm, the third most significant bit represents 160 μm, etc. The output of this counter appears on line 248 as output $Q_1$ in FIG. 12. It is this 16-bit digital number which is corrected by the correction factor appearing on line 250 from the microprocessor 214 and fed back into the load terminal 322 of the capacitive data register 320.

The 6-bit word stored in 6-bit counter 300 is true binary representation of position, in which the most significant digit represents 32 μm. However, as previously stated, the 16-bit capacitive data is formatted on the assumption that each incremental bit has a weighting of 40 μm. Thus, in order to combine these two data types in a simple way, it is necessary to multiply the 16-bit capacitive word by 40 in a digital multiplier circuit 324 so that the position (in μm's) is expressed in a conventional binary format. The converted 16-bit binary output leaving a multiplier 324 and the 6-bit binary output available at 310 are added together in a digital summing circuit 326 to provide a 24-bit word on line 260 which is also represented by $Q_3$ in the drawings. Output $Q_3$ therefore is a 24-bit binary word in which the least significant bit represents 1 μm, the next most significant bit represents 2 μm, the third most significant bit represents 4 μm, the fourth most significant bit represents 8 μm, etc. This output is then copied into the second displacement counter 264.

The electronic processing subsystem 50 also has the ability to output the absolute position data stored in the second displacement counter 264 in serial form. As previously stated, this data has been transferred to the microprocessor by way of line 294 and shift register 296 in FIG. 12. The microprocessor merely sends this data directly out on serial data line 328, through output gating 284 to the serial output terminal 329.

MICROPROCESSOR OPERATION

The microprocessor 214 controls the flow of capacitive data into the optical storage register 144 and the interaction of the optical data with the capacitive data, according to a conventional instruction set as described above. However, the microprocessor also implements a logical sequence illustrated by a logic flow chart in FIG. 14 which takes into account the actual rate of displacement versus the response time of the capacitive processing system 61 and determines whether or not a valid absolute position measurement exists in the second displacement counter 264 before the data is represented to the user as true, real time, absolute position.

Figure 14:
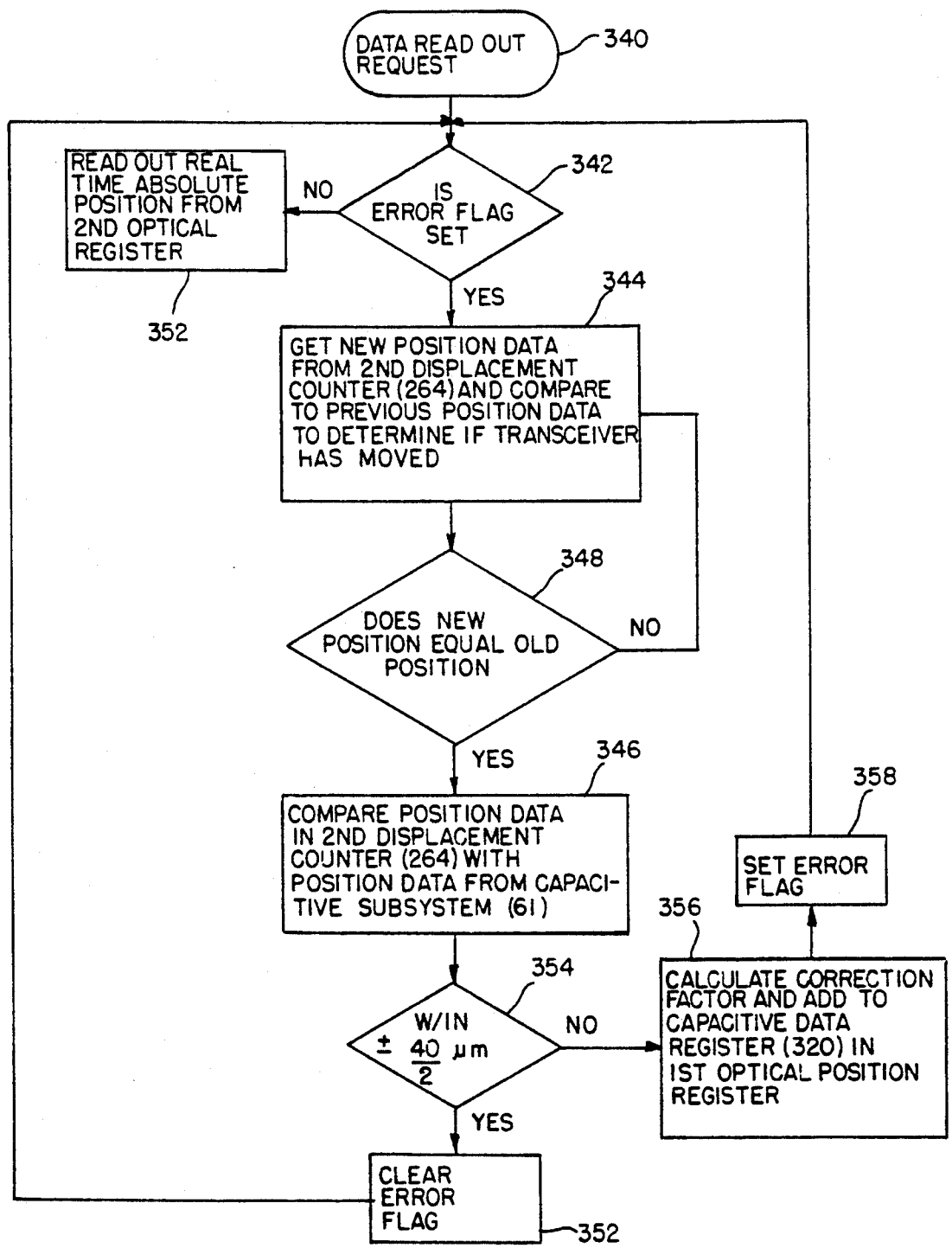
FIG. 14 is a logic flow diagram of a computer program implemented by the microprocessor of the present invention.

Basically, in the preferred embodiment, the program described by the flow chart in FIG. 14 does not permit the microprocessor to read out real time absolute position data if the transducer 34 is still moving excessively with respect to the scale 22. The program checks to make sure that the position data stored in the displacement counters 246, 264 has been updated and is stable before a real time absolute data readout is permitted.

To initiate the program, an absolute data readout request 340 is received by the microprocessor 214 from an outside agent, such as an automated machine tool upon which the invention is installed. The microprocessor then checks at decision diamond 342 whether an error flag has been set. Generally, the system starts with the error flag having been set.

If the error flag has been set, then the microprocessor obtains a new data position word from the second displacement counter 264 and compares this value to a previous position value stored in the microprocessor memory as described in action box 344. If the new position equals the old position, then the position data in the second displacement counter 264 is compared with the capacitive position data from the capacitive subsystem 61 as described in action box 346. If the new position does not equal the old position, then action 344 is repeated until the new position does equal the old position as indicated by decision diamond 348.

If the position data in the second displacement counter 264 is within the capacitive subsystem error margin of approximately ±15 μm, then the error flag is cleared as stated in action box 350 and the data is read out from the second optical storage register as set forth in action box 352. If the position data in the second displacement counter 264 is not within ±15 μm of the position data from the capacitive subsystem 61, then the microprocessor calculates a correction factor and adds this correction factor to the capacitive data register 320 of FIG. 13 as required by decision diamond 354 and action box 356. The error flag is then set at action box 358 and the process is repeated until the error flag is cleared, whereupon the data can be read out.

Other embodiments and variations of the invention are contemplated. For example, a magnetic detection system could be substituted for the optical subsystem in which magnetized stripes are used in place of the optical stripes 130, 132. In addition, the capacitive strips used in the transceiver 34 and scale 32 could be replaced with inductive structures which also measure relative movements of local magnetic fields. The application shown and described above is merely provided to illustrate a preferred embodiment in which two interrogating signals of two different types are used to achieve a high-resolution, absolute position determination. As another example, and as shown in FIG. 5, two sets of the transmitter group 62 are provided on opposite sides of the optical transducer 64. This arrangement advantageously maintains the separation distance from the center of each group, and the optical transducer 64 proportionately equal if the transducer 64 expands or contracts due to ambient changes in temperature. As previously stated, the capacitive subsystem merely measures the phase shift between the transmitted wave 66 and shifted wave 84. Thus, physical elongation or contraction of the transceiver 34 or scale 22 are geometrically compensated for by the symmetrical structure of the transceiver. An identical result would be obtained if a single transmitter group 62 were positioned in the center of the transceiver 34 while two optical transducer 64 were positioned, one on each end of the transceiver group. In addition, many alternative signal processing schemes are possible, to make best use of the relative speed, reliability and accuracy of two qualitatively different transducer subsystems, for a particular application. Also, while the present invention has been described as it would apply to a linear scale and linear measuring device, it will be appreciated by those of ordinary skill in the art that a curvilinear or circular scale could be employed with minor modifications to the described scale and detection system, and thus the present invention is readily adapted to a variety of angular and circular measurement applications.

Thus, the invention is not to be limited by the above disclosure and is to be determined in scope by the claims which follow.

We claim:

1. An absolute position determination system, comprising:
   a scale portion having first regular pattern and a second regular pattern interleaved with said first pattern so that said first and second patterns are combined into a single integrated scale pattern, the first and second patterns interacting with first and second interrogating signals of qualitatively different types;
   a transceiver portion having first and second transmission means for transmitting the first and second interrogating signals to the scale, and also having first and second receiving means for receiving the interrogating signals after interaction with the scale;
   support means for moveably supporting the scale and transceiver portions relative to each other;
   signal generating means, connected to the transceiver portion for generating the first and second interrogating signals; and
   signal processing means electronically coupled to the first and second receiving means, for processing the interrogating signals after interaction with the scale to determine the relative positions of the scale and transceiver portions within a predetermined error margin.

2. The absolute position determination system of claim 1 wherein the signal generating means operates to generate the first interrogating signal as a light beam and also operated to generate the second interrogating signal as a periodic signal.

3. The absolute position determination system of claim 2 wherein the integrated scale pattern has a plurality of parallel metallic strip groups of predetermined width positioned at a regular interval spacing, each metallic strip group having a plurality of parallel optical stripes therein at regular intervals, wherein the first transmission means on the transceiver portion has a light source cooperatively associated with the signal generating means for illuminating the stripes, and wherein the second transmission means on the transceiver portion has a plurality of regularly spaced metallic strips for accepting the periodic signal, the regularly spaced metallic strips positioned so as to be capacitively coupleable to the metallic strip groups of the scale pattern, whereby manufacturing irregularities, physical deformation of the scale portion and changes in temperature tend to affect the optical and capacitive properties of the system equally.

4. The absolute position determination system of claim 3 wherein the second transmission means on the transceiver portion includes two groups of the regularly spaced metallic strips positioned on opposite sides of the light source so that the light source and two groups of the regularly spaced metallic strips are substantially co-linear, whereby the effects of thermal expansion of the transceiver portion tend to affect the optical and capacitive properties of the system equally.

5. The absolute position determination system of claim 3 wherein the regularly spaced metallic strip groups of the scale pattern have transverse conductors interconnecting the strips within each group so that the capacitive characteristic of the group does not substantially change if electrical continuity along the strip is lost.

6. The absolute position determination system of claim 3 wherein the regular interval spacing of the metallic strip groups of the scale pattern is approximately 1.040 mm, wherein each group has a width of approximately 0.340 mm, and wherein each optical stripe has a width of approximately 0.020 mm at the regular spacing of approximately 0.040 mm.

7. The absolute position determination system of claim 3 wherein the signal processing means has an optical scale memory device for remembering optical position data from the first receiving means, a capacitive scale memory device for remembering capacitive position data from the second receiving means, and correction circuitry for updating the optical position data in the optical memory device if the optical position data is not in agreement with the capacitive position data so that the updated optical position data is indicative of the relative positions of the scale and transceiver portions substantially at all times.

8. The absolute position determination system of claim 7 wherein the optical scale memory device has first and second displacement counters each for receiving and storing duplicate sets of the updated optical position data, and serial data readout means for reading out the updated optical position data serially from the second displacement counter without effecting the duplicate set of optical position data stored in the first displacement counter.

9. The absolute position determination system of claim 1 wherein the first transmission means on the transceiver portion includes a substantially monochromatic light source spaced at a gap distance from a source grating to form the first interrogating signal, wherein the integrated scale pattern has a plurality of parallel optical stripes therein at regularly spaced intervals to interact with the first interrogating signal and generate a self image of the optical stripes on the first receiving means on the transceiver portion, and wherein the first receiving means has at least two receiver gratings positioned with respect to each other so as to be substantially 90 degrees out of spatial phase with the optical stripe self-image, whereby an optical quadrature signal having amplitudes indicative of an absolute relative position of the scale and transceiver portions between two adjacent optical stripes is generated on the first receiving means.

10. The absolute position determination system of claim 9 wherein the source and receiver gratings are substantially coplanar.

11. An absolute position determination system, comprising:
a scale portion having an optical pattern and a capacitive pattern interleaved into a single integrated scale pattern for interaction with a light interrogating signal and a voltage interrogating signal, respectively;
a transceiver portion having optical and capacitive transmission means for transmitting the optical and voltage interrogating signals to the integrated scale pattern, and also having optical and capacitive receiving means for receiving the interrogating signals after interaction with the scale;
support means for moveably supporting the scale and transceiver portions relative to each other;
signal generating means, connected to the transceiver portion for generating the optical and voltage interrogating signals; and
signal processing means electronically coupled to the optical and capacitive receiving means, for processing the interrogating signals after interaction with the scale to absolutely determine the relative positions of the scale and transceiver portions within a predetermined error margin.

12. The absolute position determination system of claim 11 wherein the integrated scale pattern has a plurality of parallel metallic strip groups of predetermined width positioned at a regular interval spacing relative to one another, each metallic strip group having a plurality of parallel optical stripes therein at regular intervals, wherein the optical transmission means on the transceiver portion has a light source cooperatively associated with the signal generating means for illuminating the strips, and wherein the capacitive means on the transceiver portion has a plurality of spaced metallic strip groups for emitting the voltage interrogating signal, wherein the regularly spaced metallic strip groups of the capacitive transmission means are positioned so as to be capacitively coupleable to the metallic strip groups of the scale pattern, whereby manufacturing irregularities, physical deformation of the scale portion and changes in temperature tend to affect the position indications of the optical and capacitive properties of the system equally.

13. The absolute position determination system of claim 12 wherein the capacitive transmission means on the transceiver portion includes two groups of the regularly spaced metallic strip groups positioned on opposite sides of the light source so that the light source and two groups of the regularly spaced metallic strips are substantially symmetrically placed with respect to the light source, whereby the effects of thermal expansion of the transceiver portion tend to affect the optical and capacitive properties of the system equally.

14. The absolute position determination system of claim 13 wherein the regularly spaced metallic strip groups of the scale pattern have transverse conductors interconnecting the strips within each group so that the capacitive characteristic of the group does not substantially change if electrically continuity along a strip is lost.

15. The absolute position determination system of claim 13 wherein the regular interval spacing of the metallic strip groups of the scale pattern is approximately 1.040 mm, wherein each group has a width of approximately 0.340 mm, and wherein each optical stripe has a width of approximately 0.020 mm at the regular spacing of approximately 0.040 mm.

16. The absolute position determination system of claim 13 wherein the signal processing means has an optical scale memory device for remembering optical position data from the optical receiving mans, a capacitive scale memory device for receiving capacitive position data from the capacitive receiving means, and correction circuitry for updating the optical position data in the optical scale memory device if the optical position data is not in agreement with the capacitive position data so that the updated optical position data is indicative of the relative positions of the scale and transceiver portions substantially at all times.

17. The absolute position determination system of claim 16 wherein the optical scale memory device has first and second displacement counters each for receiving and storing duplicate sets of the updated optical position data, and serial data readout means for reading out the updated optical position data serially from the second displacement counter without effecting the duplicate set of optical position data stored in the first displacement counter.

18. The absolute position determination system of claim 11 wherein the optical transmission means on the transceiver portion includes a substantially monochromatic light source spaced at a gap distance from a source grating to form the optical interrogating signal, wherein the optical pattern of the integrated scale pattern has a plurality of parallel optical stripes therein at regularly spaced intervals to interact with the optical interrogating signal and generate a self image of the optical stripes on the optical receiving means on the transceiver portion, and wherein the optical receiving means has at least two receiver gratings positioned with respect to each other so as to be substantially 90 degrees out of spatial phase with the optical stripe self-image, whereby an optical quadrature signal having amplitudes indicative of an absolute relative position of the scale and transceiver portions between two adjacent optical stripes is generated on the optical receiving means.

19. The absolute position determination system of claim 18 wherein the source and receiver gratings are substantially coplanar.

20. A method for determining the absolute relative position of a scale portion and transceiver portion, comprising the steps of:
capacitively determining the relative position of the scale and transceiver portions to within a first error margin;
storing the capacitively determined position as position data in a first memory;
optically determining the relative position of the scale and transceiver portions to within a second error margin, wherein the second error margin is smaller than the first error margin but wherein the optically determined position can contain an ambiguity regarding gross position data;
storing the optically determined position as position data in a second memory;
comparing the position data stored in the second memory with the position data stored in the first memory;
generating a correction factor which is an integer number of the optical wavelength present on the scale if the position data stored in the first and second memory are not in agreement and applying the correction factor to the position data stored in the second memory; and
reading out the position data stored in the second memory.

21. A scale for an absolute position determination system, comprising an integrated scale pattern having a plurality of parallel metallic strip groups of predetermined width positioned at a regular interval spacing for capacitive coupling with a first transmitting device said metallic strip groups being interleaved with a respective optical group each of which contains a plurality of parallel optical stripes at regular intervals for optical coupling with a second transmitting device, whereby manufacturing irregularities, physical deformation of the scale portion and changes in temperature tend to effect the optical and capacitive properties of the scale equally.

22. An absolute positioning determination system, comprising:
a scale portion having a first regular pattern and a second regular pattern interleaved with said first pattern so that said first and second patterns are combined into a single integrated scale pattern, the first and second patterns interacting with first and second interrogating signals of qualitatively different types;
a transducer portion having first and second sensing means for sensing the position in a defined measurement direction relative to the first and second pattern on the scale portion via scale interaction with the first and second interrogating signals;
support means for supporting the scale and transceiver portions relative to each other in a way that makes them moveable relative to each other in the defined measurement direction;
signal generating means, connected to the transceiver portion for generating the first and second interrogating signals; and
signal processing means electronically coupled to the first and second sensing means, for processing the interrogating signals after interaction with the scale to allow determination of the absolute relative position of the scale and transceiver portions within a predetermined error margin.

23. The absolute position determination system of claim 22 wherein the first sensing means comprises an electrooptic sensor in interaction with the first regular pattern of the scale and the second sensing means comprises a capacitive position sensor in interaction with the second regular pattern of the scale.

24. The absolute position determination system of claim 23 wherein the integrated scale pattern has a plurality of parallel strips of predetermined width positioned at regular interval spacing in the direction of the measurement axis, the parallel strips forming an optical pattern, which interacts with the first sensing means to form an optical encoder, and wherein the strips are of electrically conducting material and groups of such strips are electrically connected together to form a periodic electrode pattern in the direction of the measurement axis to form a capacitive position sensor in interaction with the second sensing means.

25. The absolute measuring system of claim 24, wherein the parallel optical strips which are electrically connected to form a periodic electrode pattern to form a capacitive position sensor are redundantly connected to minimize the effect of broken individual connections.

26. The absolute positioning system according to claim 24, wherein the capacitive system is of absolute measuring type over a given measuring range and has a resolution that is smaller than the period length of the optical pattern, for eliminating the ambiguity of the optical measuring system when the two measurements are combined into an absolute measurement of position.

27. The absolute position measuring system of claim 26, wherein the second sensing means is divided into two symmetrical parts positioned symmetrically on opposite sides of the first sensing means in direction of the measurement axis, whereby the effective center of sensing with the second sensing means coincides with the center of the first sensing means such that the effect of thermal expansion of the framework carrying the sensing means has minimal influence on the change in spacing between effective center of detection of the two different sensing means.

28. The absolute position measuring system of claim 24, wherein the effective centers of detection of the first and second sensing means are substantially coplanar in a plane extending parallel to the measuring axis and perpendicular to the scale surface, so that rotations of the framework carrying the sensing means, about an axis perpendicular to the scale surface, will tend to translate the first and second sensing means by substantially the same amount along the measuring axis, and maintain the relative relationship for purposes of absolute position computation.

29. The absolute position measuring system of claim 28, where the first and second sensing means are substantially colinear on a line parallel to the measuring axis, so that rotations about any axis perpendicular to the measuring axis will tend to translate the first and second sensing means by substantially the same amount along the measuring axis and maintain the relative relationship for purposes of absolute position computation.

30. The absolute position determination system of claim 24, wherein the signal processing means has a first memory device for remembering the position data from the first sensing means, including a counter of number of periods of the first sensing means scale pattern, and a second memory device for remembering the position data from the second sensing means, and correction circuitry for updating the position data from the first memory device with respect to the accumulated number of periods of the first sensing means scale pattern if this number is not in agreement with the position data from the second memory device, so that the position data from the first memory device is indicative of the absolute relative position of the scale and transceiver portions at all times.

31. The absolute position determination system of claim 30, with means for reading out the change of position on two data lines in the form of quadrature pulses and also means for reading out the absolute position data in serial form on the same lines on demand from data receiver system, further with means for recording the change of position during the serial data readout time and outputting extra quadrature pulses on the two data lines after the end of the serial data readout time, to correct for the position change during the serial data readout time.

32. An absolute position determining system, comprising:
   a scale portion having a optical diffraction pattern and an electrode pattern;
   a transceiver portion;
   capacitive interrogating means having electrical transmission means for transmitting an electrical interrogation signal from the transceiver portion to the electrode pattern on the scale portion, said capacitive interrogating means further including receiver means for receiving the electrical interrogation signal after interaction with the electrode pattern on the scale portion as a function of the relative position between the scale portion and the transceiver portion over a first range and within a first margin or error;
   optical interrogating means for transmitting an optical interrogation signal from the transceiver portion to the optical diffraction pattern on the scale portion, the optical interrogating mans further including receiver means for receiving the optical interrogation signal after interaction with the diffraction pattern on the scale portion, the interaction being a function of the relative position between the scale portion and the transceiver portion over a second range that is substantially smaller than the first range and within a second margin of error that is substantially smaller than the first margin of error;
   support means for moveably supporting the scale and transceiver portions relative to each other; and
   signal processing means electrically coupled to the capacitive interrogating means and the optical interrogating means for determining the absolute position of the scale portion relative to the transceiver portion over a range determined by the range of the capacitive interrogating means and with an accuracy determined by the accuracy of the optical interrogating means.

33. The absolute position determining system of claim 32 wherein the optical diffraction pattern and the electrode pattern are mounted on a common substrate that is carried by the scale portion.

34. The absolute position determining system of claim 33 wherein the optical diffraction pattern is interleaved with the electrode pattern so that manufacturing irregularities, physical deformation of the scale portion and changes in temperature tend to equally affect the accuracy of the capacitive interrogating means and the optical interrogating means.

35. The absolute position determining system of claim 34 wherein at least a portion of the optical diffraction pattern is formed from the same material as the electrode pattern thereby allowing at least a portion of the optical diffraction pattern with which the optical interrogation signal interacts to also function as a part of the electrode pattern with which the electrical interrogation signal interacts.

36. The absolute position determining system of claim 32 wherein at least a portion of the optical diffraction pattern is formed from the same material as the electrode pattern thereby allowing at least a portion of the optical diffraction pattern with which the optical interrogation signal interacts to also function as a part of the electrode pattern with which the electrical interrogation signal interacts.

37. A method of determining the absolute position between a scale portion and a reference portion, comprising:
   capacitively determining the relative position between the scale portion and the reference portion over a first range and within a first margin of error;
   optically determining the relative position between the scale portion and the reference portion over a second range that is substantially smaller than the first range and within a second margin of error that is substantially smaller than the first margin of error; and
   using the capacitive position determination and the optical position determination to determine the absolute position of the scale portion relative to the reference portion over a range corresponding to the range of the capacitive position determination and with an accuracy determined by the accuracy of the optical position determination.

38. The method of claim 37 wherein the relative position between the scale portion and the reference portion is optically determined by creating a diffraction grating formed at least in part by placing a first diffraction grating on said scale portion and a second optical grating on said reference portion so that said second grating optically interferes with the diffraction pattern from said first grating as a function of relative movement between the scale portion and the reference portion.

* * * * *

UNITED STATES PATENT AND TRADEMARK OFFICE
CERTIFICATE OF CORRECTION

PATENT NO. : 5,225,830
DATED : July 6, 1993
INVENTOR(S) : Nils I. Andermo et al.

It is certified that error appears in the above-identified patent and that said Letters Patent is hereby corrected as shown below:

In column 20, claim 2, line 17, please delete "operated" and substitute therefor --operates--.

In column 22, claim 14, line 25, please delete "electrically" and substitute therefor --electrical--.

In column 22, claim 16, line 37, please delete "mans" and substitute therefor --means--.

In column 25, claim 30, line 2, please delete "counter" and substitute therefor --count--.

In column 25, claim 32, line 40, please delete "or" and substitute therefor --of--.

In column 25, claim 32, line 44, please delete "mans" and substitute therefor --means--.

Signed and Sealed this

Sixteenth Day of May, 1995

*Attest:*

*Attesting Officer*

BRUCE LEHMAN
*Commissioner of Patents and Trademarks*